(12) United States Patent
Bouche et al.

(10) Patent No.: US 9,508,642 B2
(45) Date of Patent: Nov. 29, 2016

(54) SELF-ALIGNED BACK END OF LINE CUT

(71) Applicant: GLOBALFOUNDRIES Inc., Grand Cayman (KY)

(72) Inventors: Guillaume Bouche, Albany, NY (US); Andy Chih-Hung Wei, Queensbury, NY (US); Mark A. Zaleski, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 196 days.

(21) Appl. No.: 14/463,803

(22) Filed: Aug. 20, 2014

(65) Prior Publication Data

US 2016/0056104 A1 Feb. 25, 2016

(51) Int. Cl.
| | |
|---|---|
| *H01L 21/4763* | (2006.01) |
| *H01L 23/528* | (2006.01) |
| *H01L 23/522* | (2006.01) |
| *H01L 23/532* | (2006.01) |
| *H01L 21/768* | (2006.01) |
| *H01L 23/52* | (2006.01) |
| *H01L 21/311* | (2006.01) |

(52) U.S. Cl.
CPC ....... *H01L 23/528* (2013.01); *H01L 21/31144* (2013.01); *H01L 21/768* (2013.01); *H01L 21/76802* (2013.01); *H01L 21/76834* (2013.01); *H01L 23/52* (2013.01); *H01L 23/5226* (2013.01); *H01L 23/53228* (2013.01)

(58) Field of Classification Search
CPC .............................. H01L 21/768; H01L 23/52
USPC .................................. 257/774; 438/622, 638
See application file for complete search history.

(56) References Cited

U.S. PATENT DOCUMENTS

| | | | |
|---|---|---|---|
| 6,987,067 B2 | 1/2006 | Fischer et al. | |
| 2013/0280909 A1 | 10/2013 | Lung et al. | |
| 2016/0190009 A1* | 6/2016 | Wallace | H01L 21/76883 257/774 |

* cited by examiner

*Primary Examiner* — David Vu
*Assistant Examiner* — Brandon Fox
(74) *Attorney, Agent, or Firm* — Williams Morgan, P.C.

(57) ABSTRACT

Embodiments of the present invention provide a method for self-aligned metal cuts in a back end of line structure. Sacrificial Mx+1 lines are formed above metal Mx lines. Spacers are formed on each Mx+1 sacrificial line. The gap between the spacers is used to determine the location and thickness of cuts to the Mx metal lines. This ensures that the Mx metal line cuts do not encroach on vias that interconnect the Mx and Mx+1 levels. It also allows for reduced limits in terms of via enclosure rules, which enables increased circuit density.

17 Claims, 30 Drawing Sheets

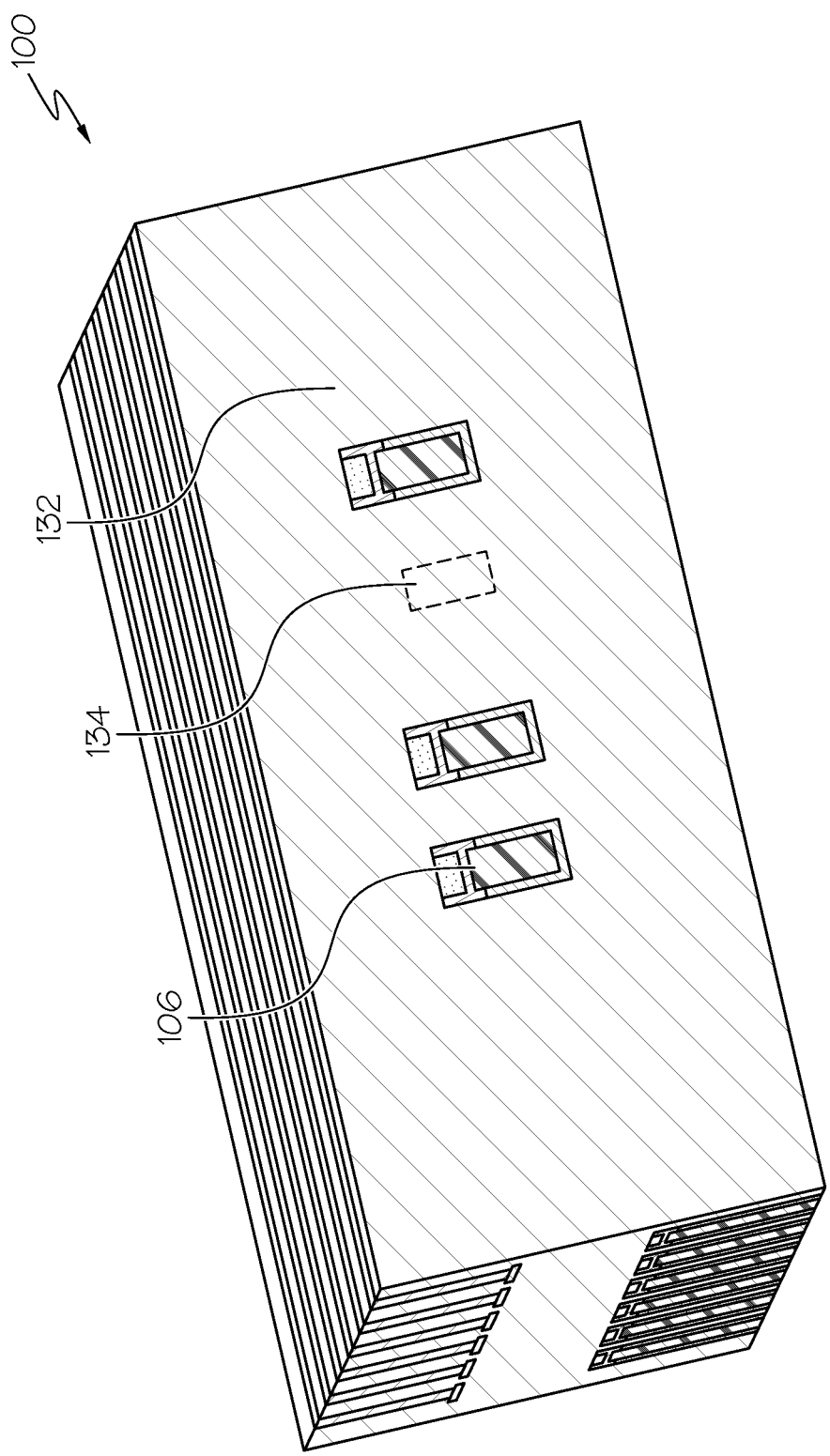

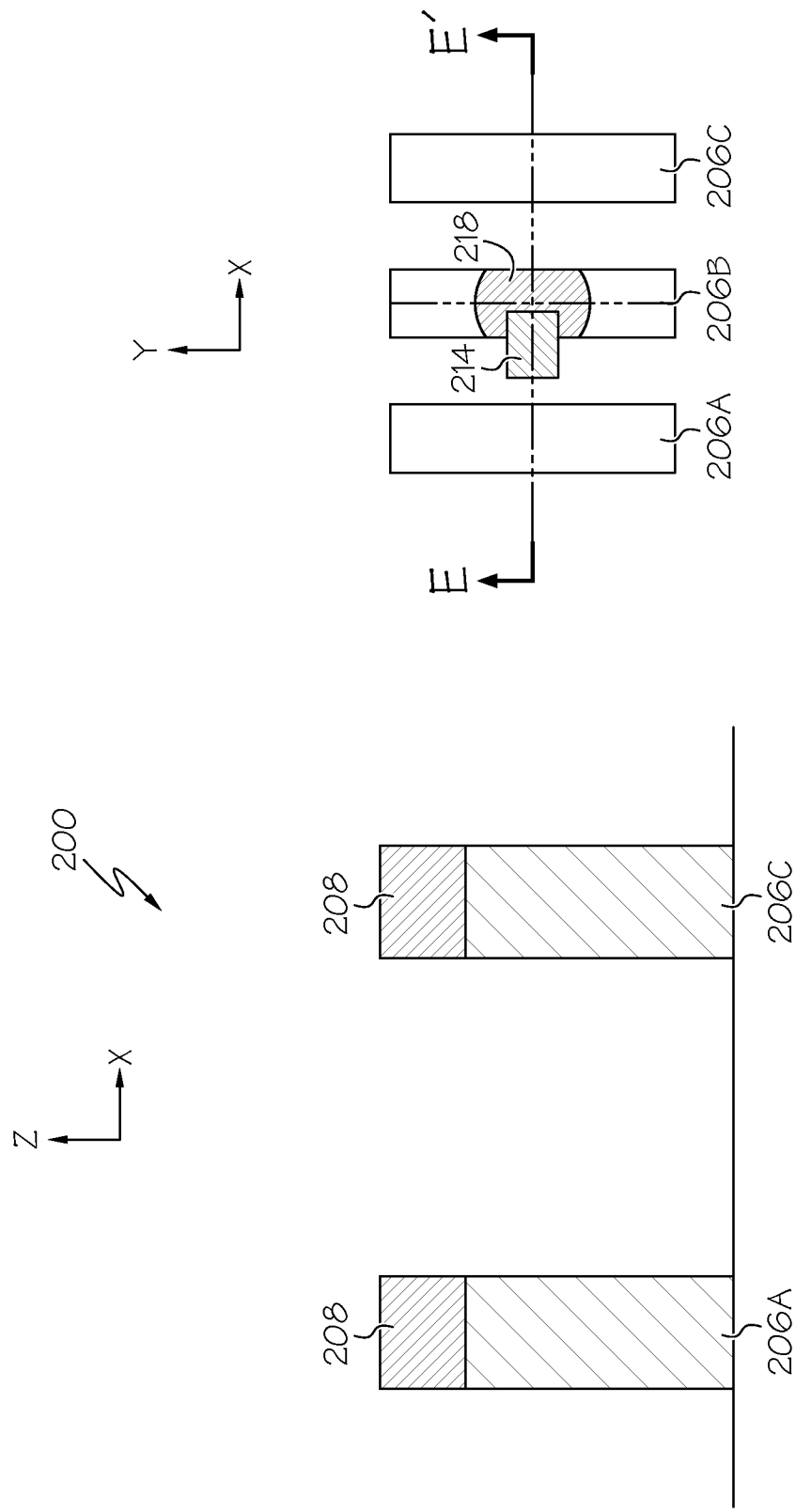

… (1)

SELF-ALIGNED BACK END OF LINE CUT

FIELD OF THE INVENTION

The present invention relates generally to semiconductor fabrication, and more particularly, to a self-aligned back end of line cut.

BACKGROUND

As the semiconductor industry introduces new generations of integrated circuits (IC's) having higher performance and greater functionality, the density of the elements that form those IC's is increased, while the dimensions, sizes, and spacing between the individual components or elements are reduced. These device geometries having smaller dimensions are creating new manufacturing challenges. In a typical integrated circuit, there may be many metallization layers and interconnecting via layers formed in a back end of line (BEOL) interconnect structure. The BEOL interconnect structure connects various devices (e.g., transistors, capacitors, etc.) to form functional circuits. During fabrication, it is necessary to form cuts and connections amongst metal lines to create the needed connectivity. As critical dimensions continue to shrink, this can be challenging. It is therefore desirable to have improvements to address the aforementioned challenges.

SUMMARY

Embodiments of the present invention provide a method for self-aligned metal cuts in a back end of line structure. Sacrificial Mx+1 lines are formed above metal Mx lines. Spacers are formed on each Mx+1 sacrificial line. The gap between the spacers is used to determine the location and thickness of cuts to the Mx metal lines. This ensures that the Mx metal line cuts do not encroach on vias that interconnect the Mx and Mx+1 levels. It also allows for reduced limits in terms of via enclosure rules, which enables increased circuit density.

In a first aspect, embodiments of the present invention provide a method of forming a semiconductor structure, comprising: forming a plurality of Mx metal lines in a dielectric layer; depositing a capping layer over the plurality of Mx metal lines; forming a plurality of sacrificial Mx+1 lines on the etch stop layer; forming spacers adjacent to each of the plurality of sacrificial Mx+1 lines; depositing a first resist layer over the plurality of sacrificial Mx+1 lines; forming an opening in the first resist layer at a location corresponding to a line cut for at least one Mx metal line of the plurality of Mx metal lines; removing the capping layer at the location corresponding to the line cut; and performing a metal etch to cut the at least one Mx metal line of the plurality of Mx metal lines.

In a second aspect, embodiments of the present invention provide a method of forming a semiconductor structure, comprising: forming a plurality of Mx metal lines in a dielectric layer; depositing a capping layer over the plurality of Mx metal lines; depositing an etch stop layer over the dielectric layer and capping layer; forming a plurality of sacrificial Mx+1 lines on the etch stop layer; forming spacers adjacent to each of the plurality of sacrificial Mx+1 lines; removing a portion of the etch stop layer disposed between spacers of adjacent sacrificial Mx+1 lines; depositing a first resist layer over the plurality of sacrificial Mx+1 lines; forming an opening in the first resist layer at a location corresponding to a line cut for at least one MX metal line of the plurality of Mx metal lines; performing an isotropic etch on the capping layer at the location corresponding to the line cut; and performing an anisotropic metal etch to cut the at least one MX metal line of the plurality of Mx metal lines.

In a third aspect, embodiments of the present invention provide a semiconductor structure, comprising: a plurality of Mx copper lines disposed in a dielectric layer; a capping layer disposed over the plurality of Mx copper lines; a plurality of Mx+1 copper lines formed in the dielectric layer and oriented perpendicularly to the plurality of Mx+1 lines; and a via connecting one of the plurality of Mx+1 copper lines to one of the plurality of Mx copper lines, wherein the via is disposed within a line width from an end of the one of the plurality of Mx copper lines.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
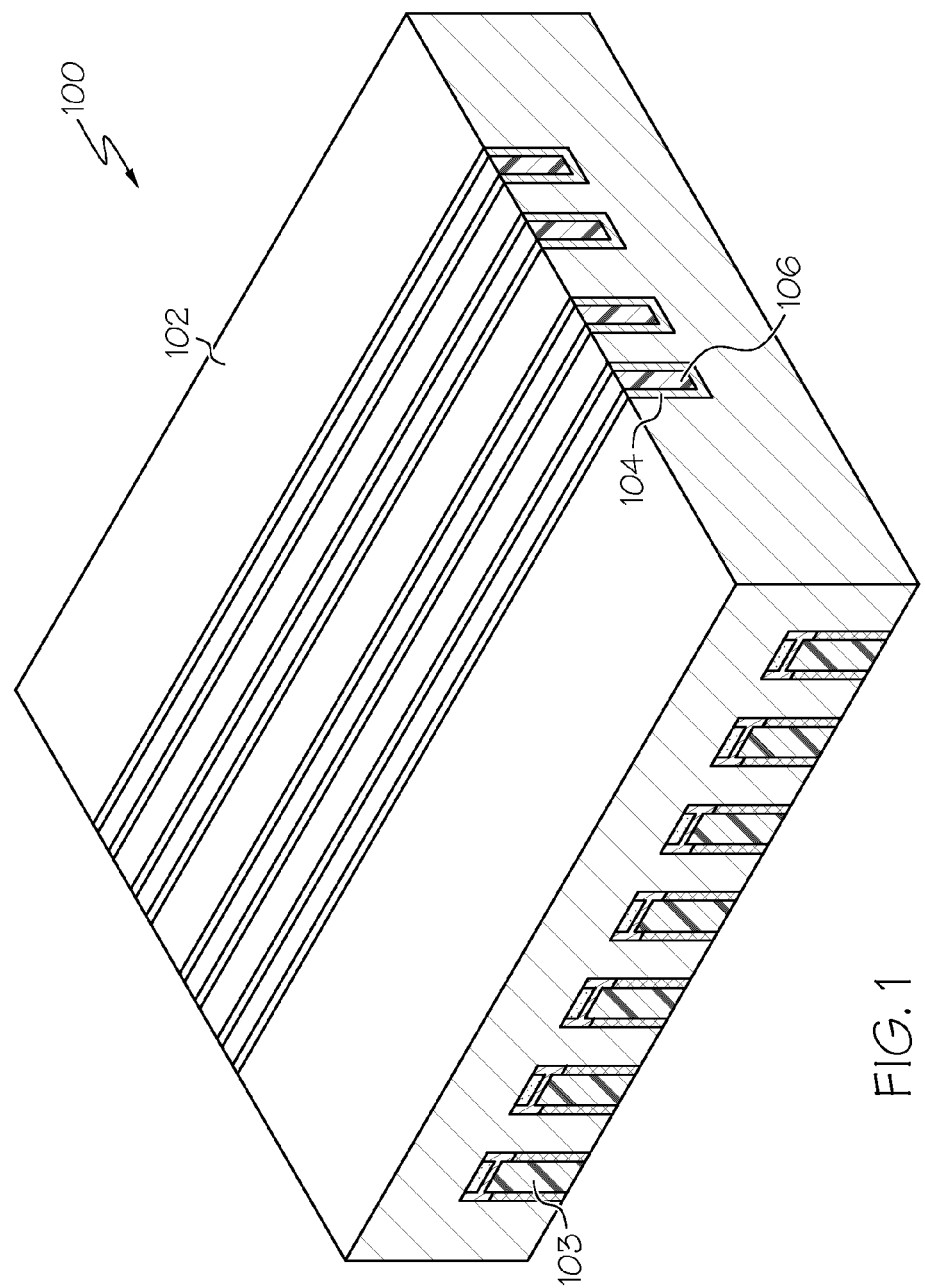

Often, similar elements may be referred to by similar numbers in various figures (FIGs) of the drawing, in which case, typically the last two significant digits may be the same, the most significant digit being the number of the drawing figure (FIG). Furthermore, for clarity, some reference numbers may be omitted in certain drawings.

FIG. 1 is a semiconductor structure at a starting point for embodiments of the present invention.

Figure 2:
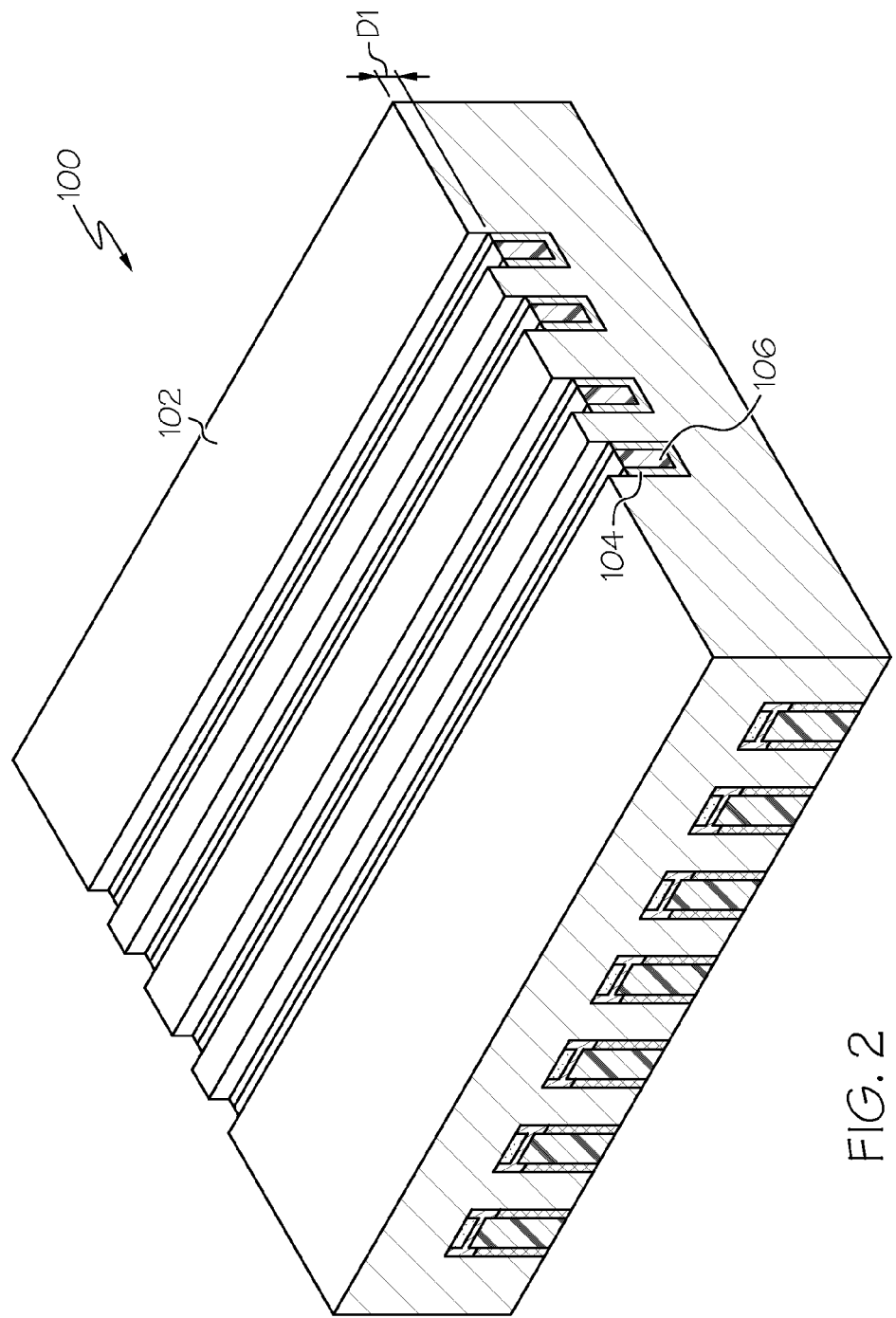

FIG. 2 is a semiconductor structure after a subsequent process step of recessing the Mx metal lines.

Figure 3:
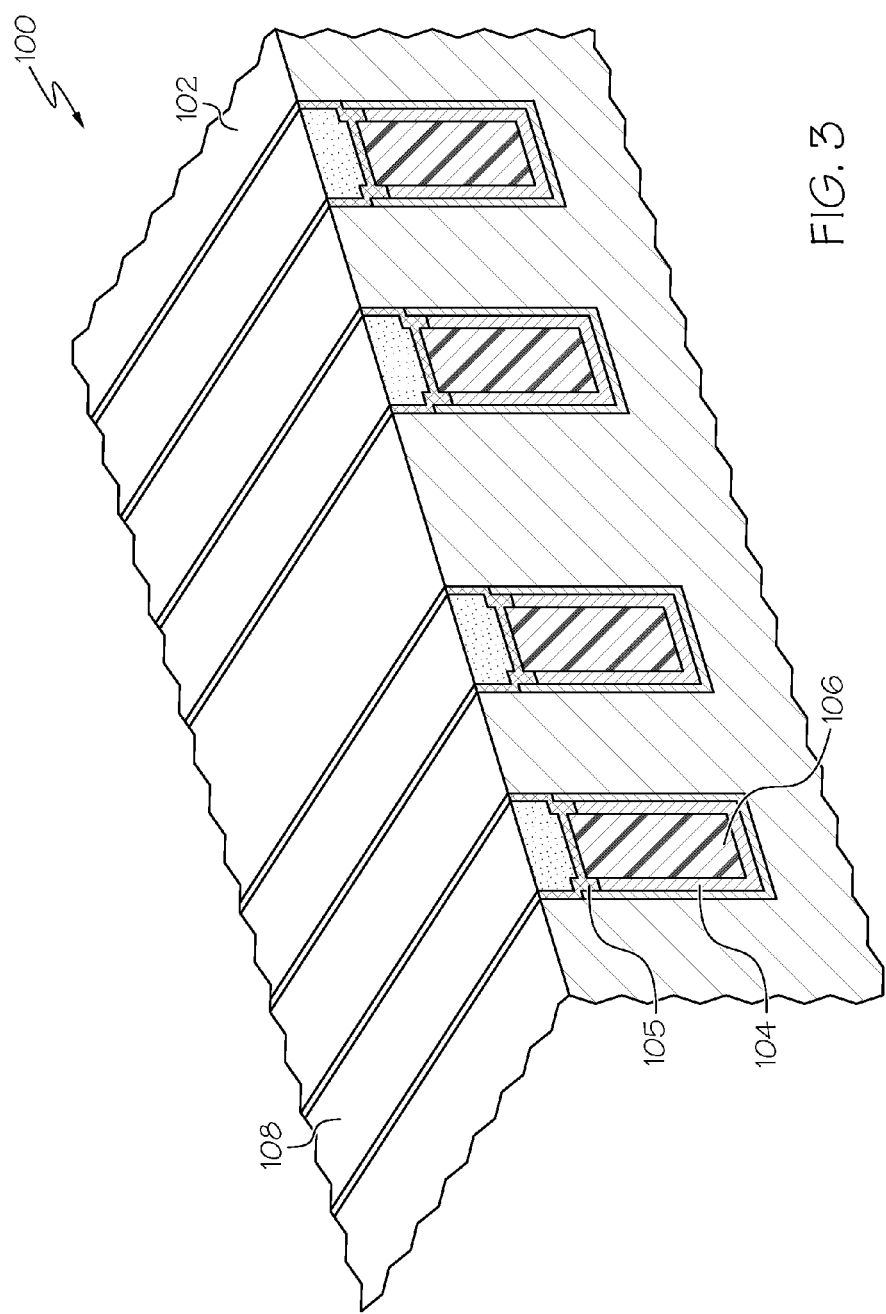

FIG. 3 is a semiconductor structure after a subsequent process step of depositing a capping layer on the metal lines.

Figure 4:
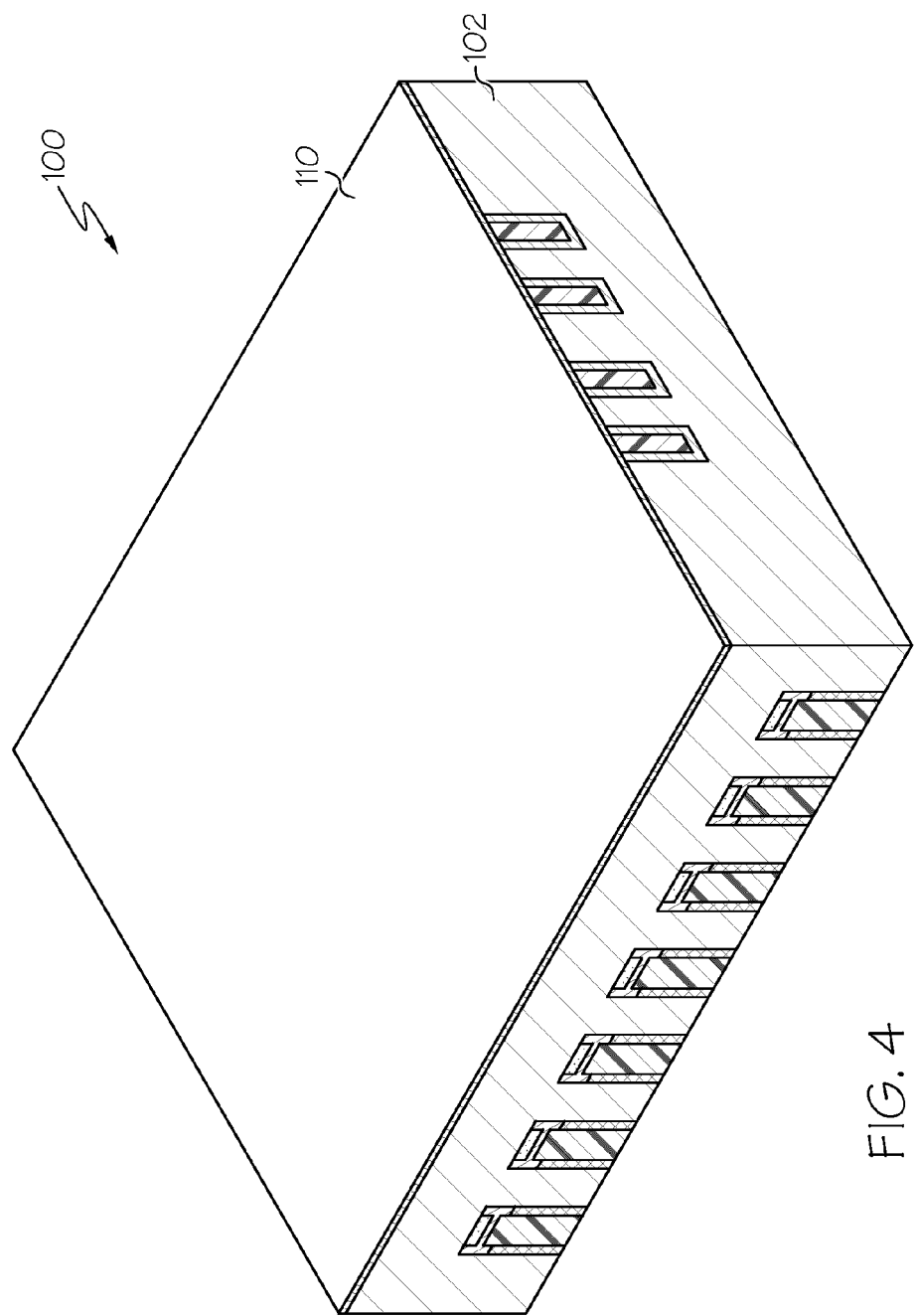

FIG. 4 is a semiconductor structure after a subsequent process step of depositing an etch stop layer over the semiconductor structure.

Figure 5:
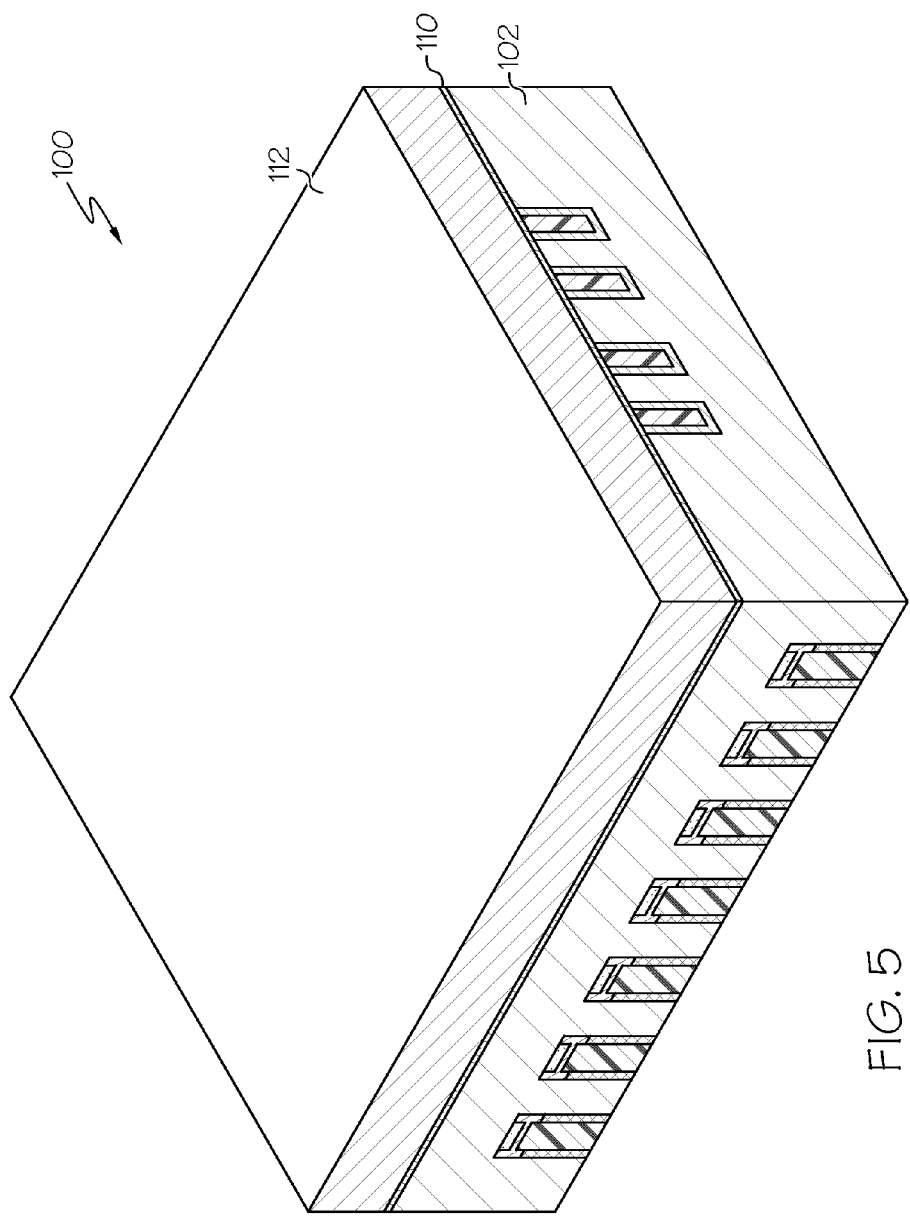

FIG. 5 is a semiconductor structure after a subsequent process step of depositing a sacrificial layer over the semiconductor structure.

Figure 6:
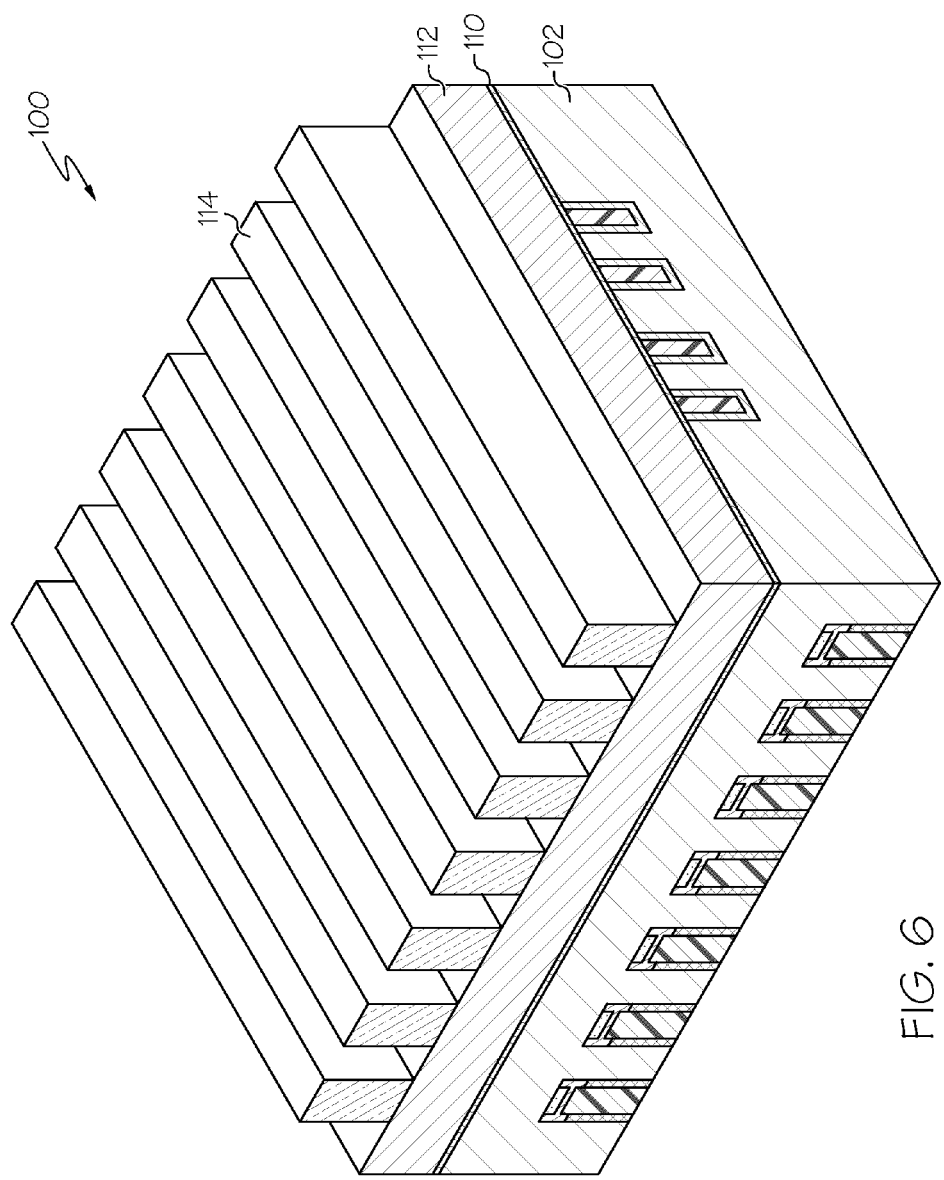

FIG. 6 is a semiconductor structure after a subsequent process step of patterning a resist layer on the semiconductor structure.

Figure 7:
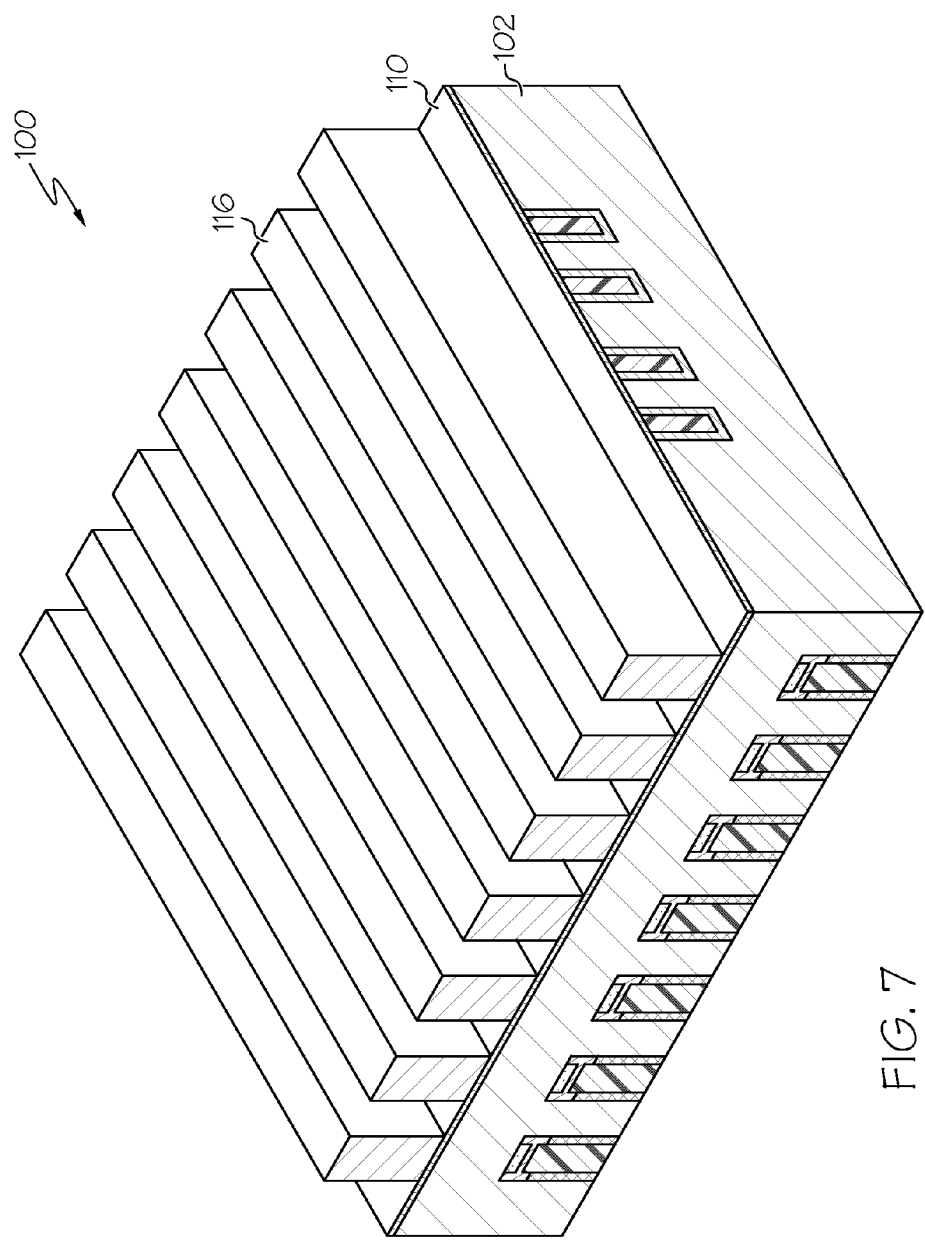

FIG. 7 is a semiconductor structure after a subsequent process step of forming dummy Mx+1 lines on the semiconductor structure.

Figure 8:
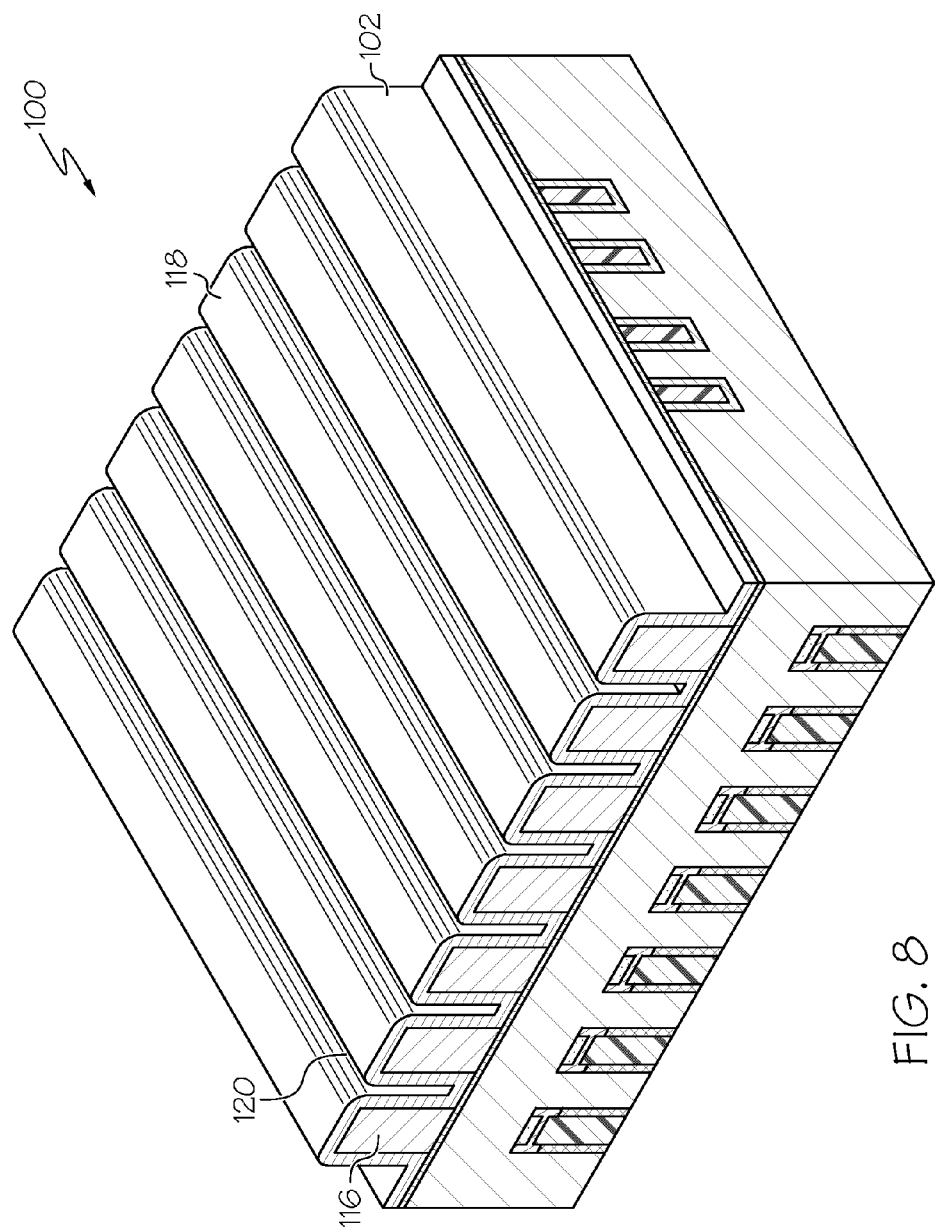

FIG. 8 is a semiconductor structure after a subsequent process step of depositing a spacer layer on the semiconductor structure.

Figure 9:
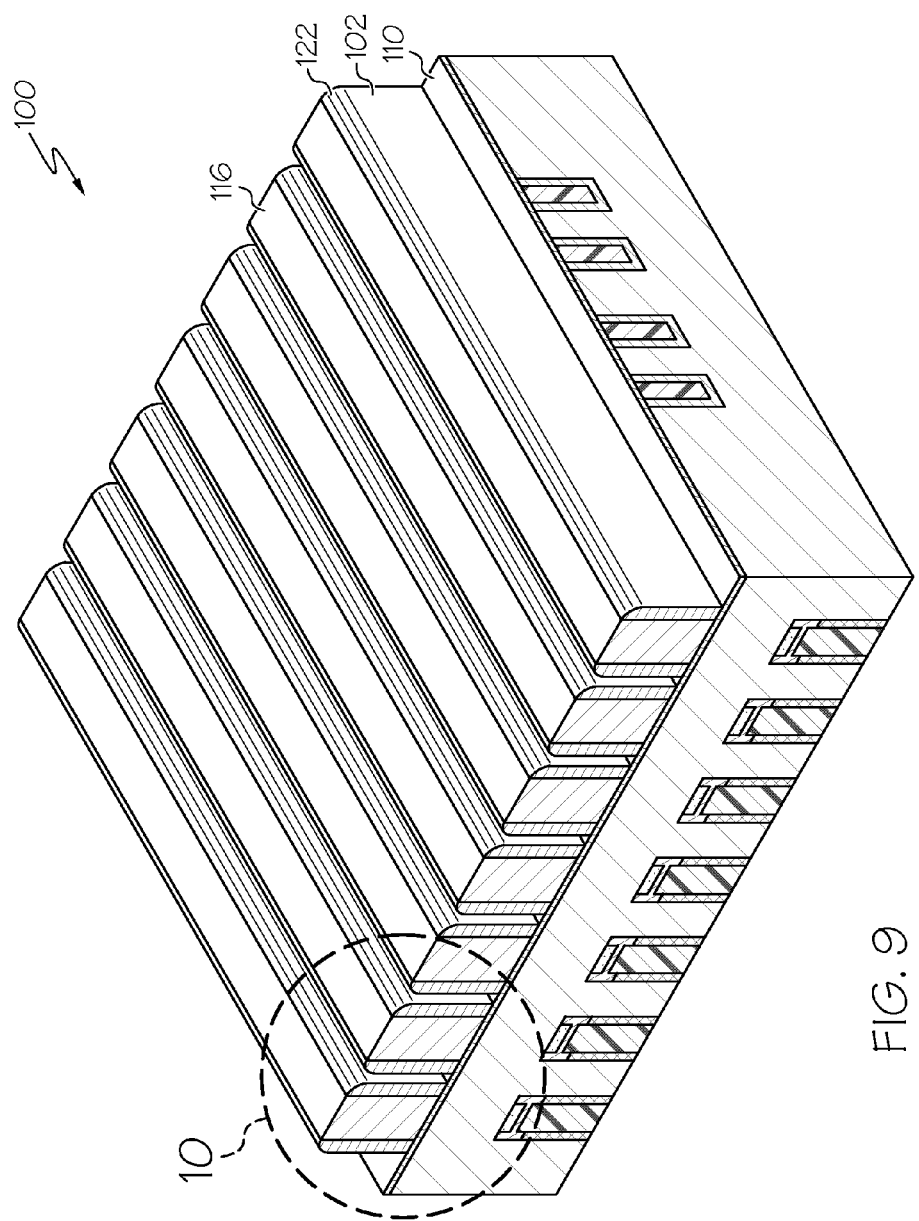

FIG. 9 is a semiconductor structure after a subsequent process step of recessing the spacer layer on the semiconductor structure.

Figure 10:
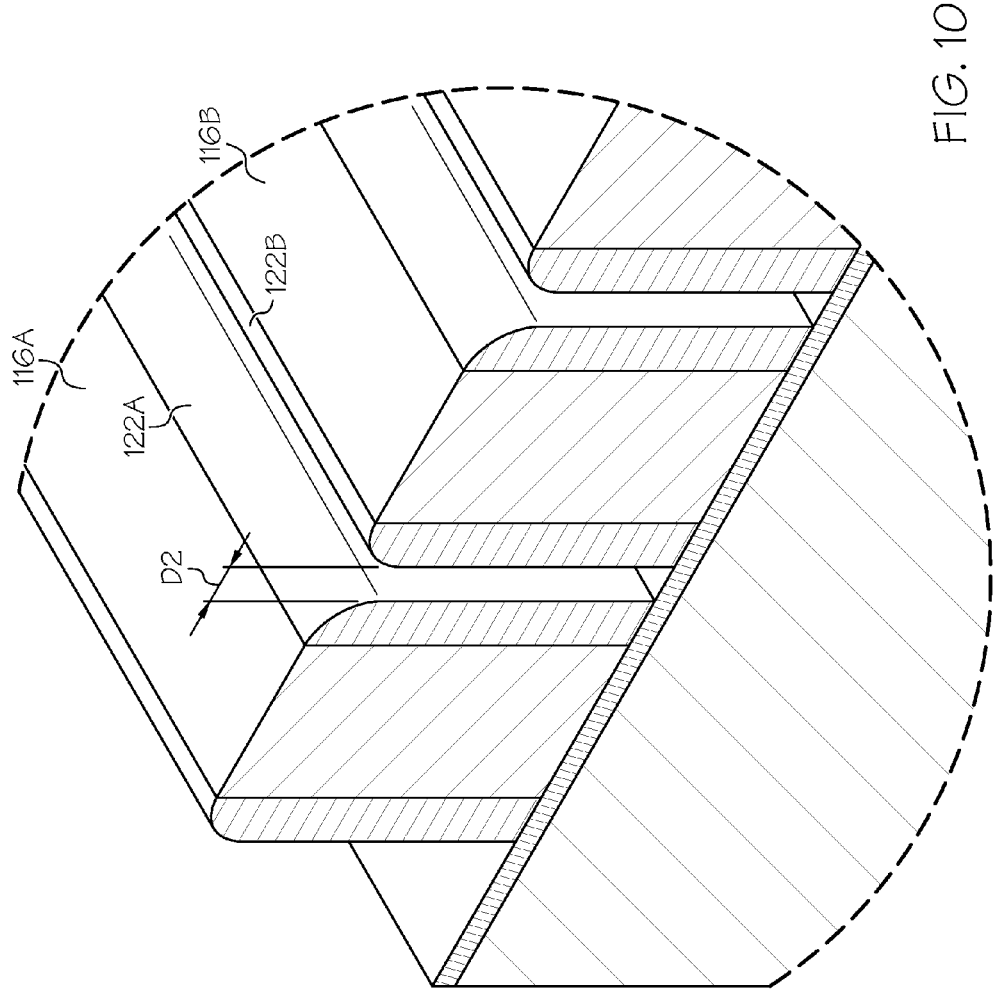

FIG. 10 is a detailed view of the spacers of FIG. 9.

Figure 11:
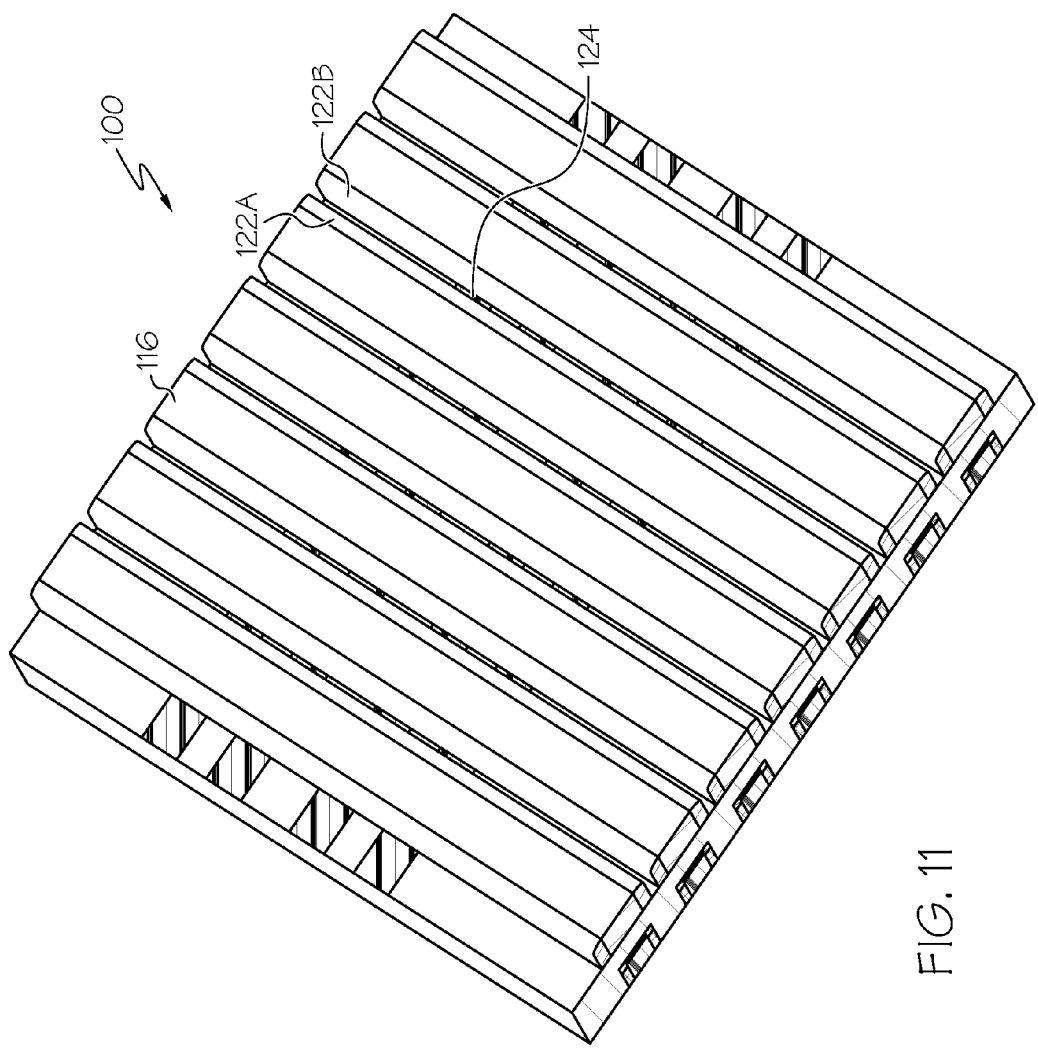

FIG. 11 is a semiconductor structure after removal of the etch stop layer.

Figure 12A:
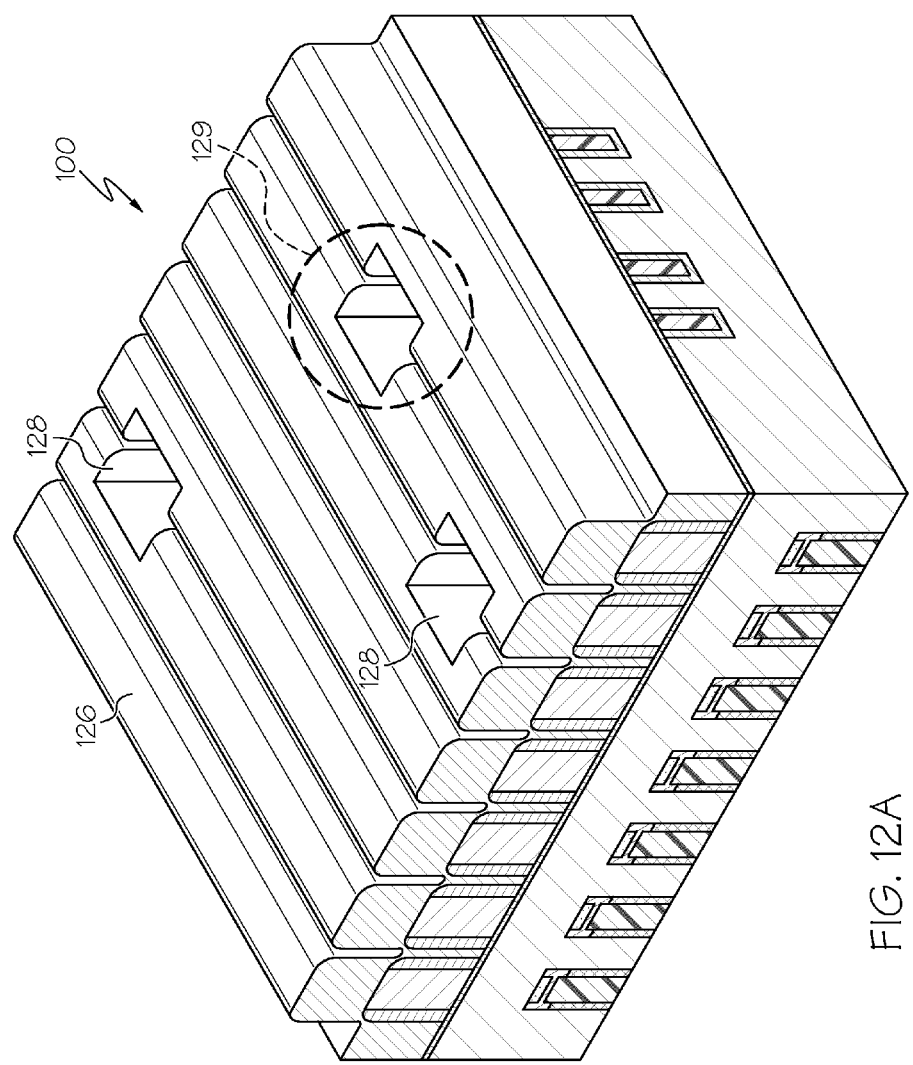
Figure 12B:
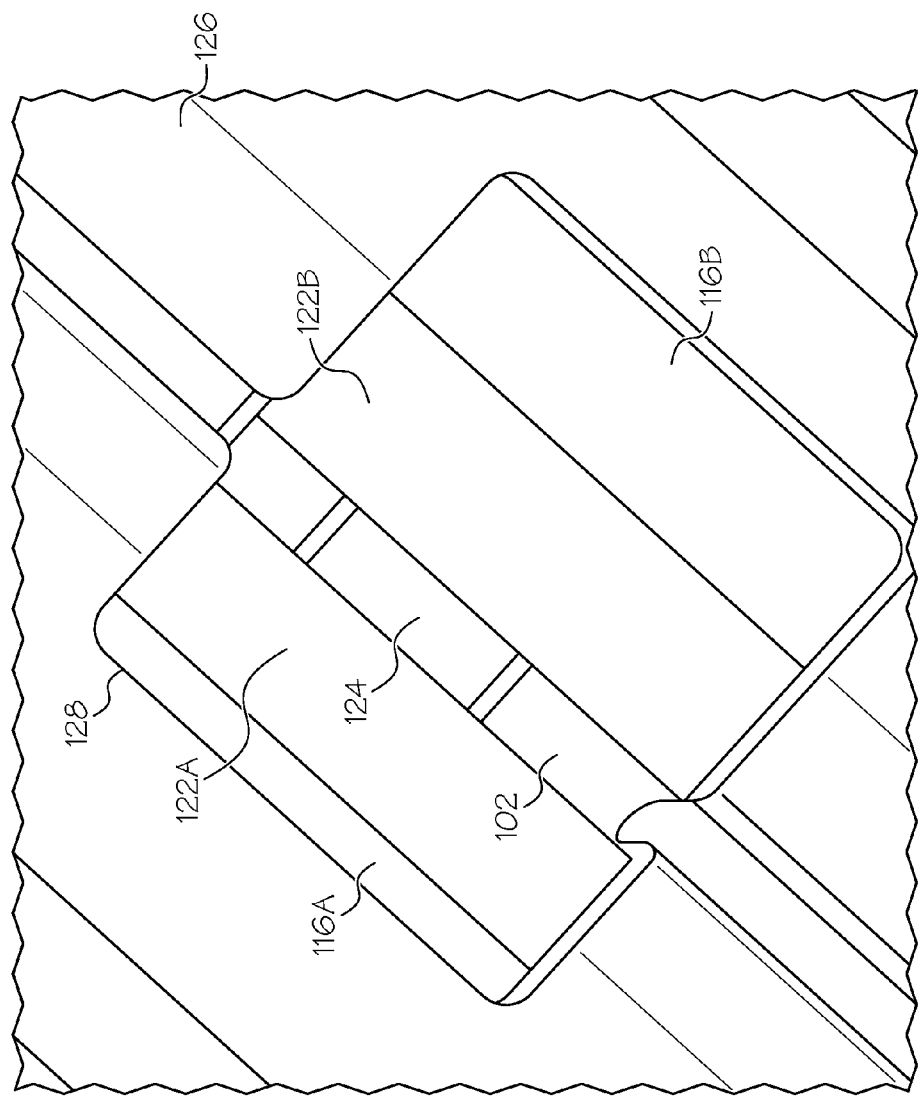

FIGS. 12A and 12B are a semiconductor structure after a subsequent process step of depositing and patterning a resist layer on the semiconductor structure.

Figure 13:
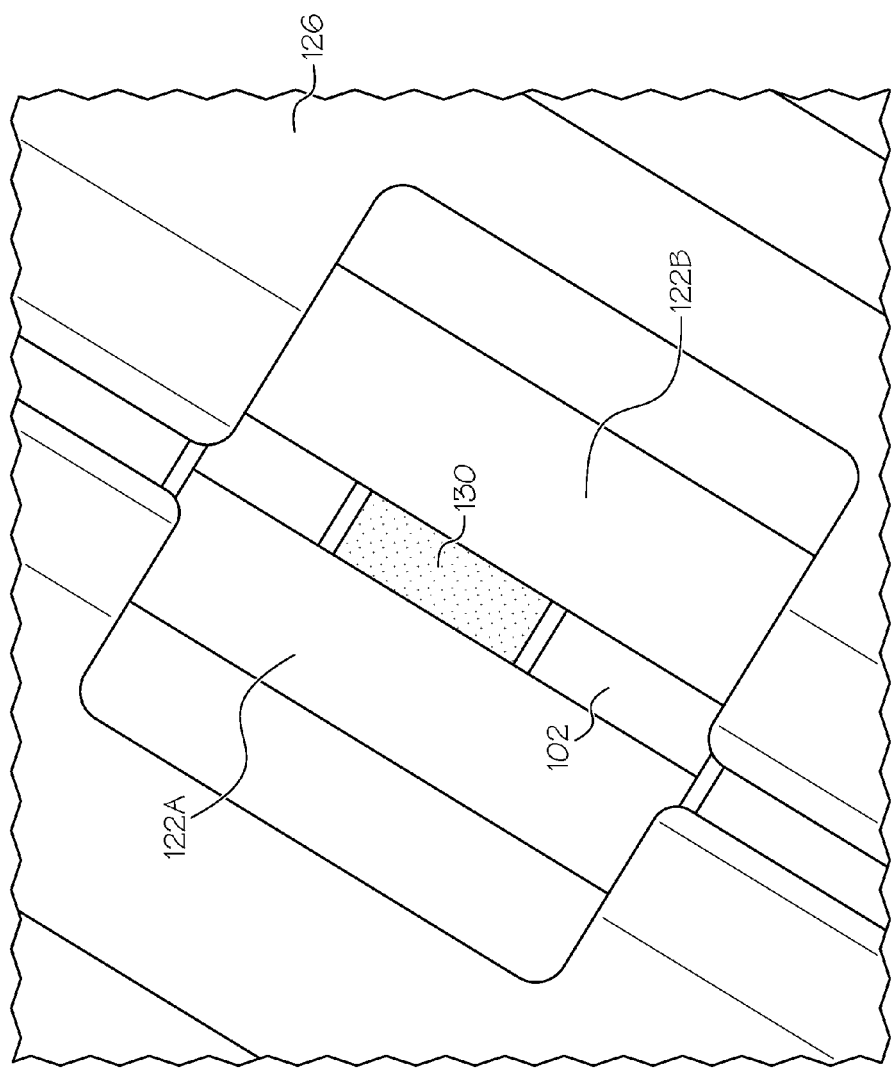

FIG. 13 is detail of a semiconductor structure after a subsequent process step of performing a metal line cut.

Figure 14:
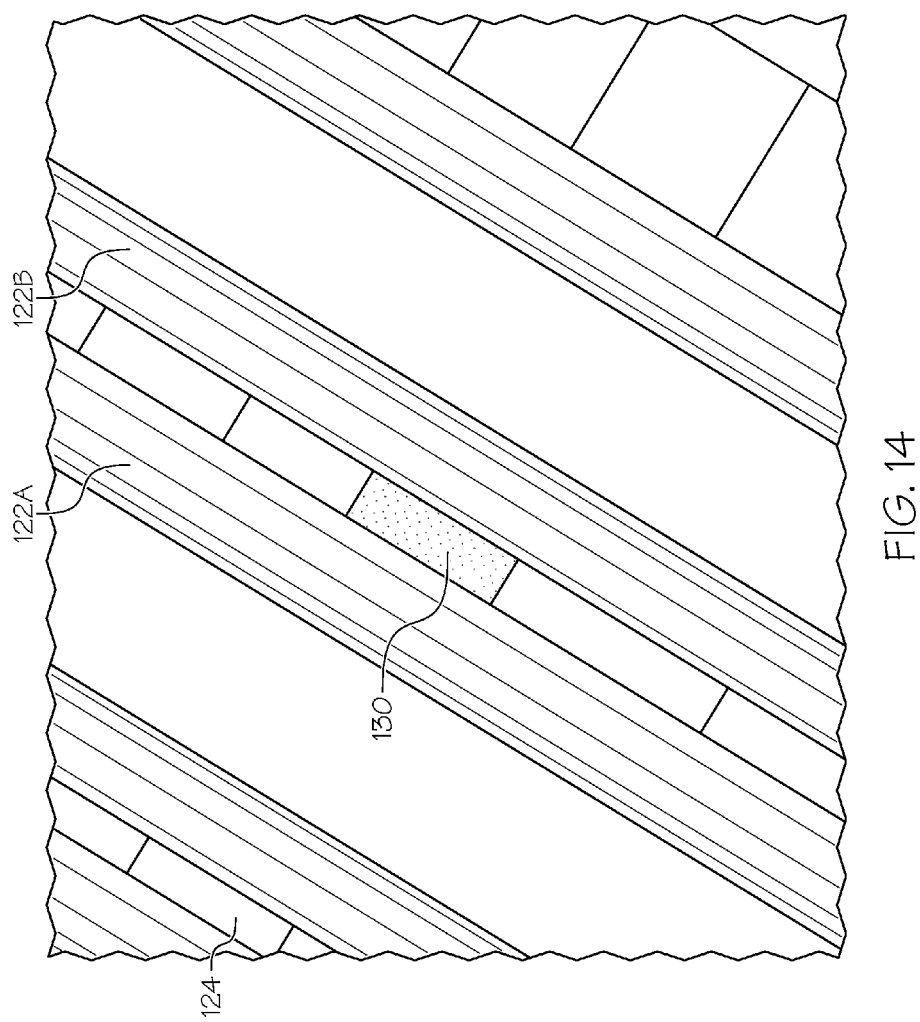

FIG. 14 is detail of a semiconductor structure after a subsequent process step of removing the resist layer.

Figure 15A:
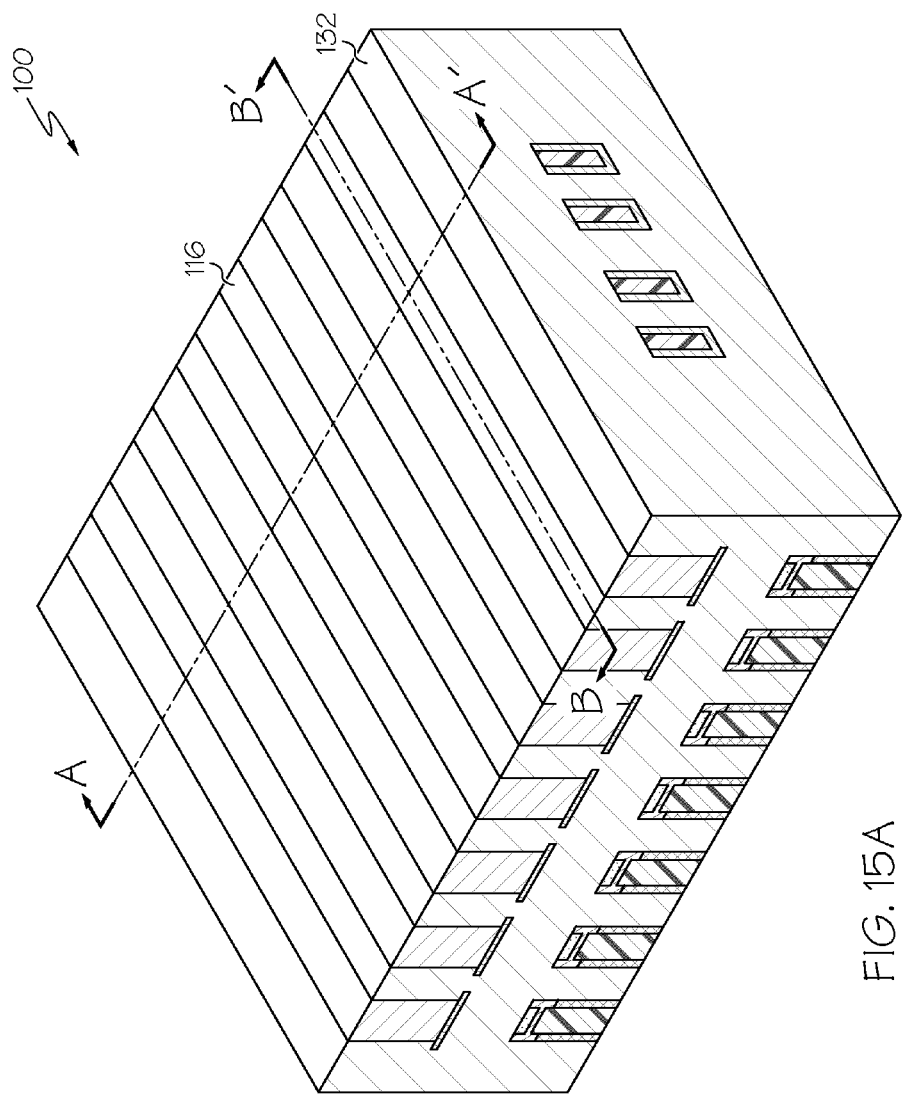
Figure 15B:
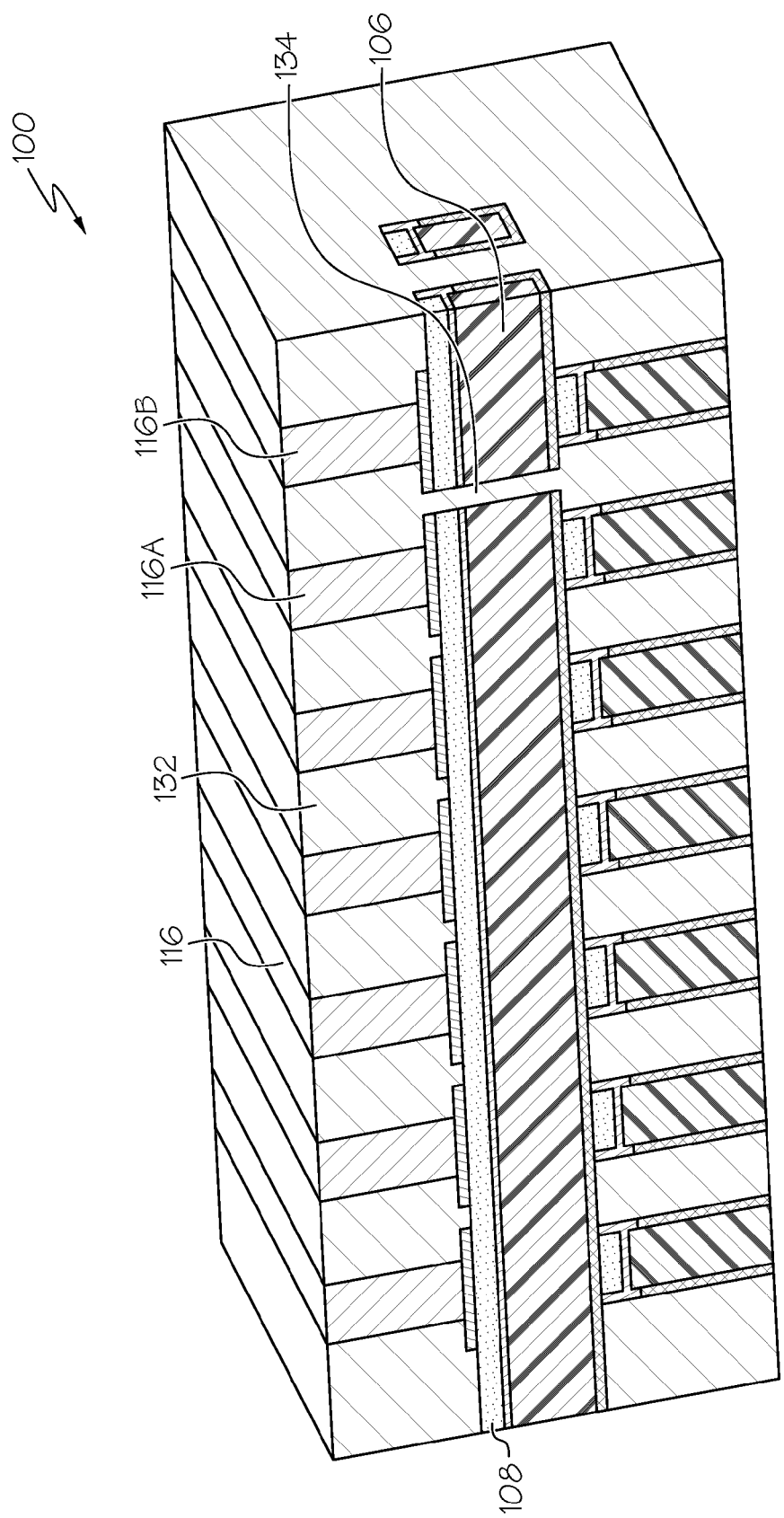

FIGS. 15A, 15B, and 15C show views of a semiconductor structure after subsequent process steps of depositing additional dielectric material and planarization.

Figure 16:
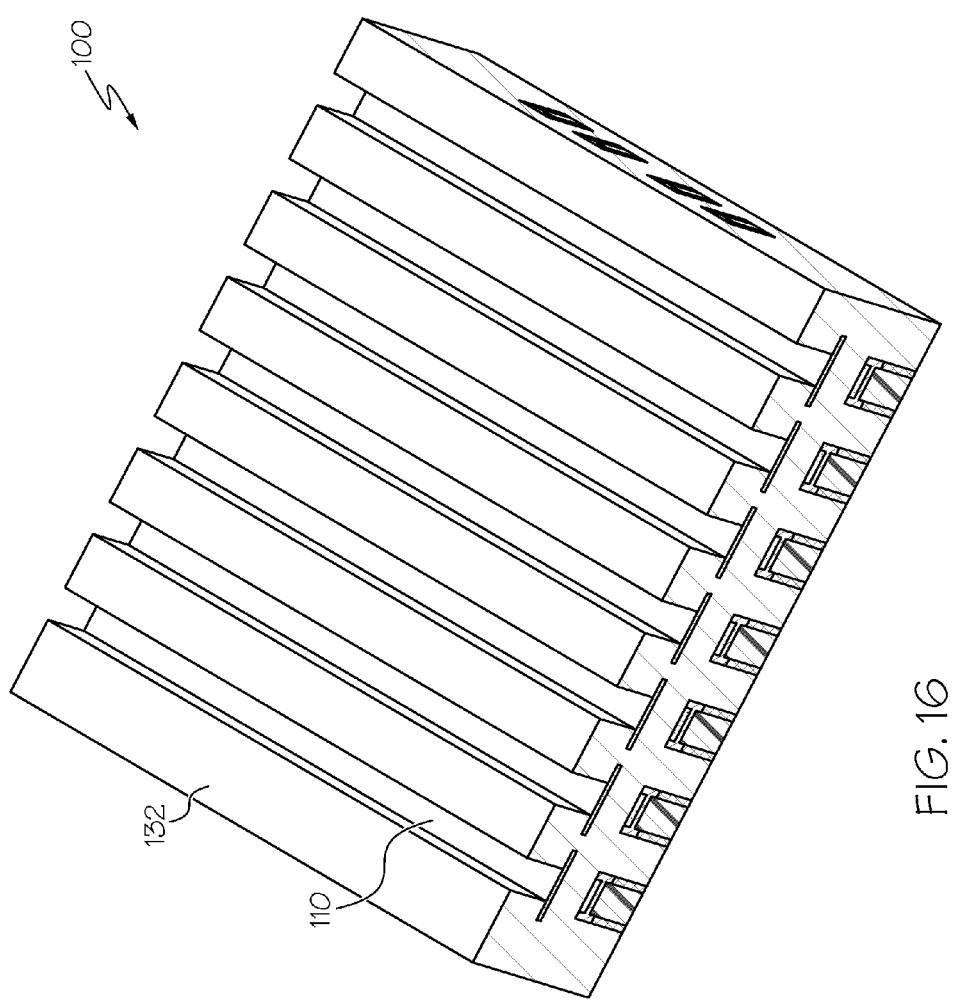

FIG. 16 is a semiconductor structure after a subsequent view of removing the dummy Mx+1 lines.

Figure 17:
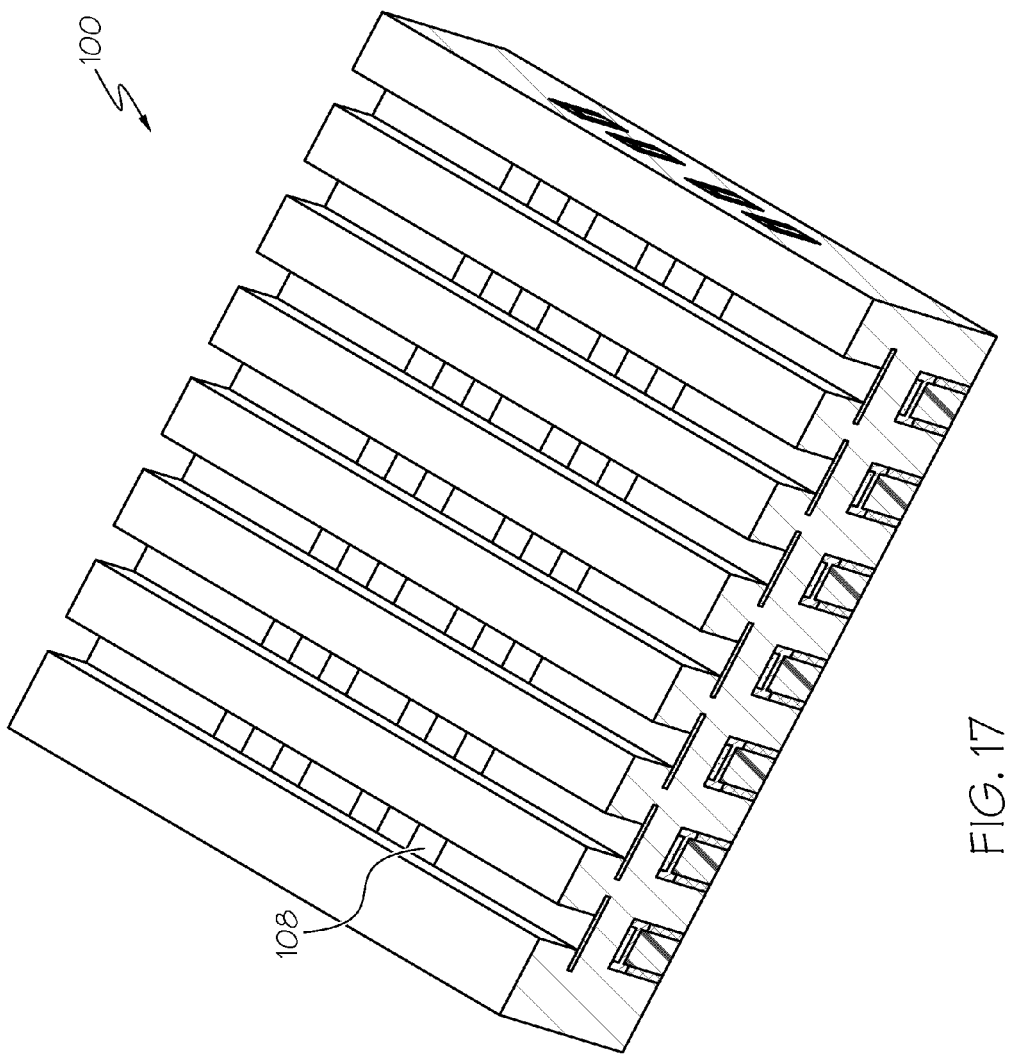

FIG. 17 is a semiconductor structure after a subsequent process step of removing the etch stop layer.

Figure 18:
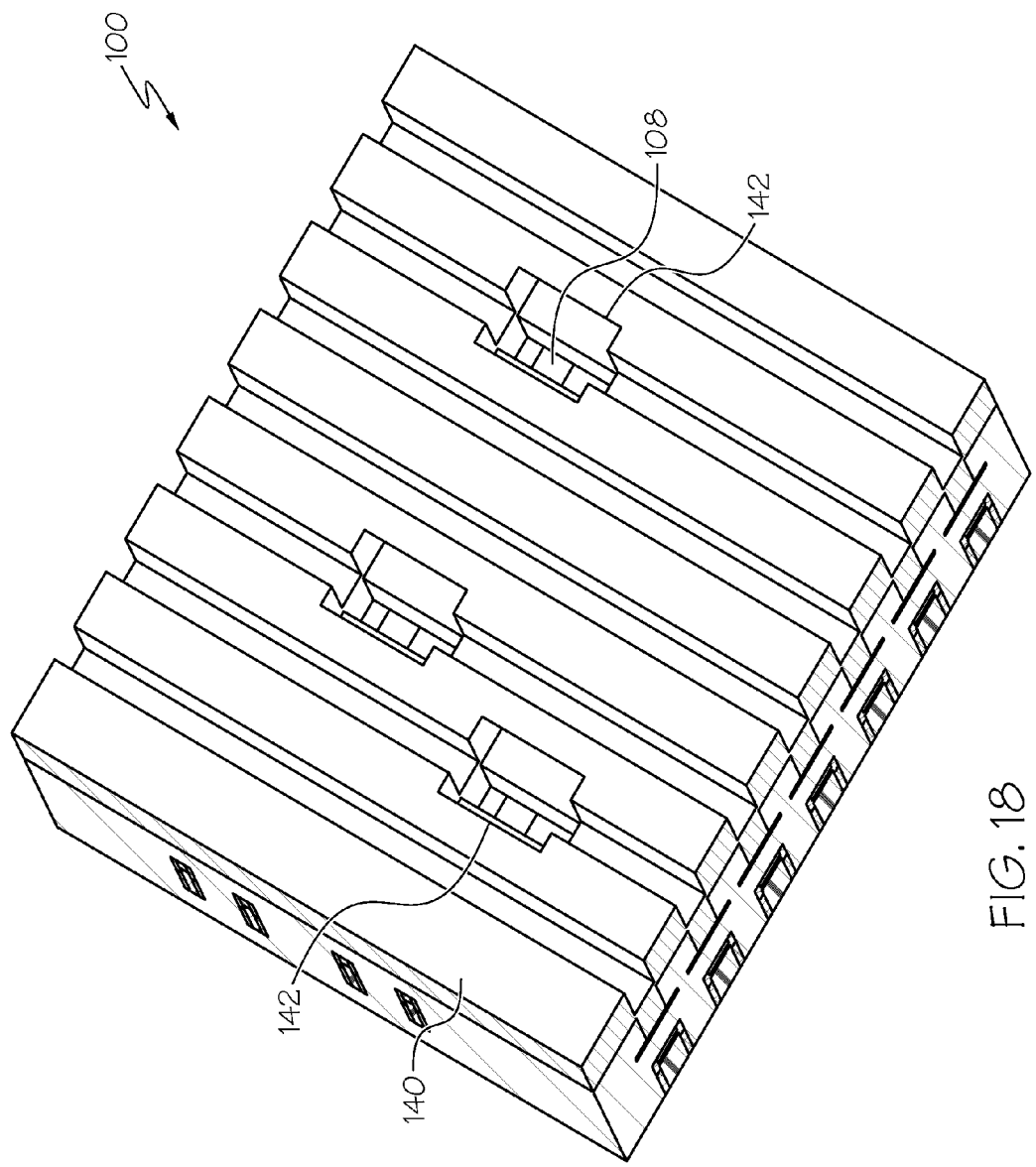

FIG. 18 is a semiconductor structure after a subsequent process step of depositing and patterning a resist layer on the semiconductor structure.

Figure 19:
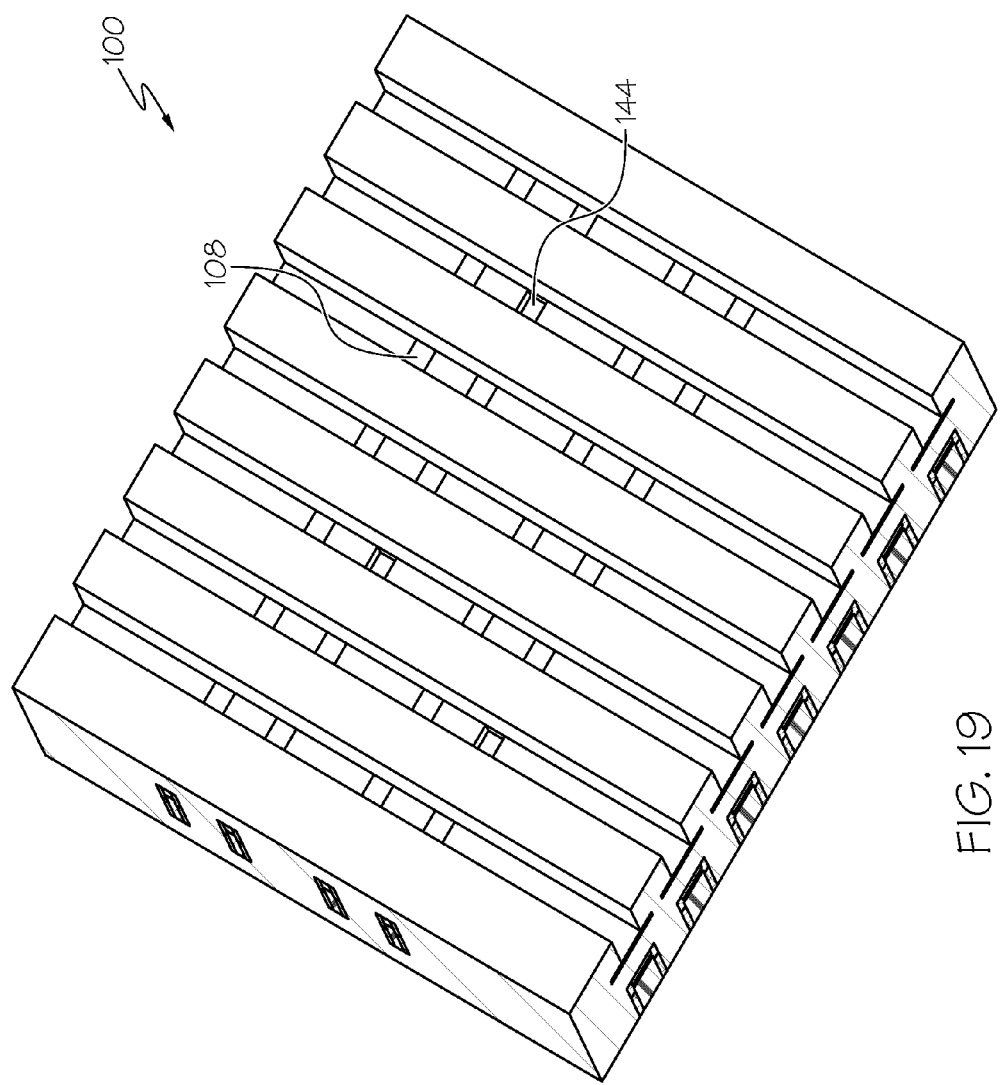

FIG. 19 is a semiconductor structure after a subsequent process step of forming via cavities over selected Mx lines.

Figure 20:
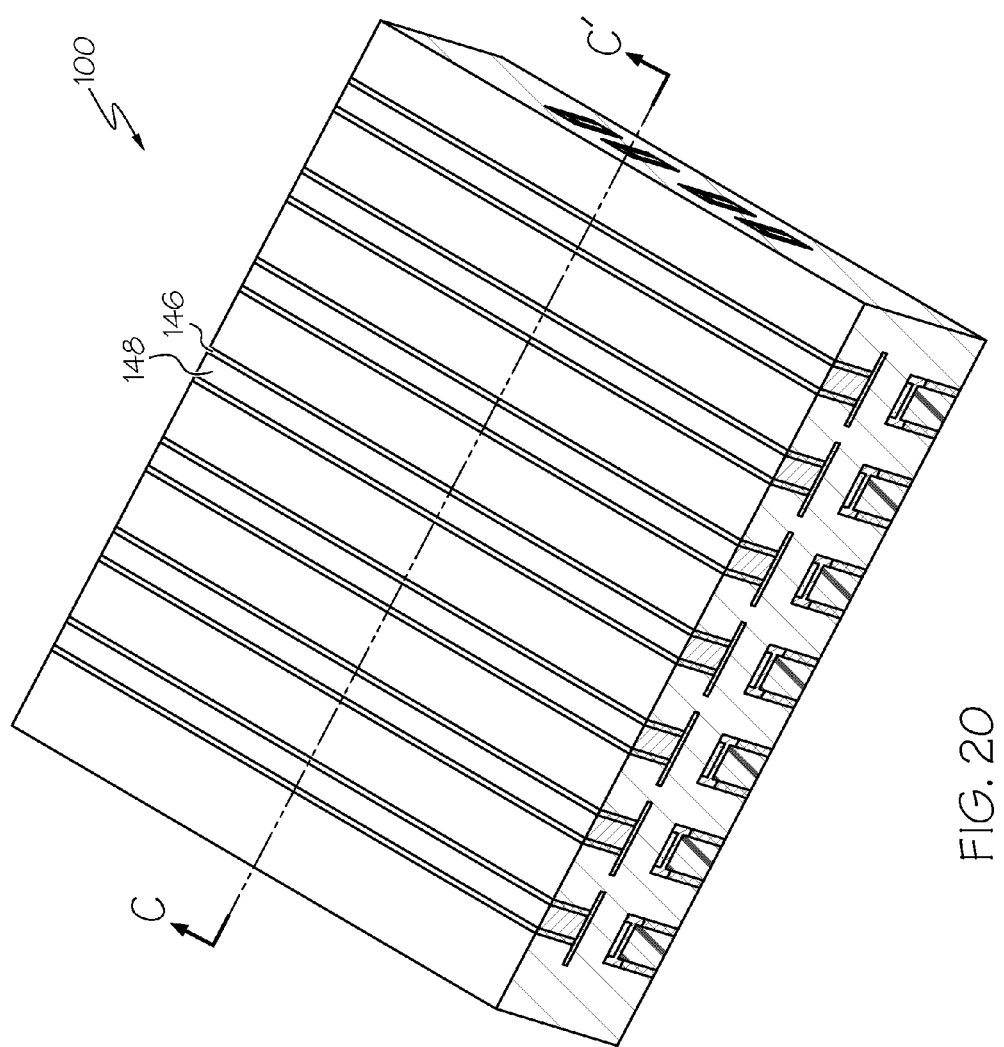

FIG. 20 is a semiconductor structure after a subsequent process step of forming Mx+1 lines.

Figure 21:
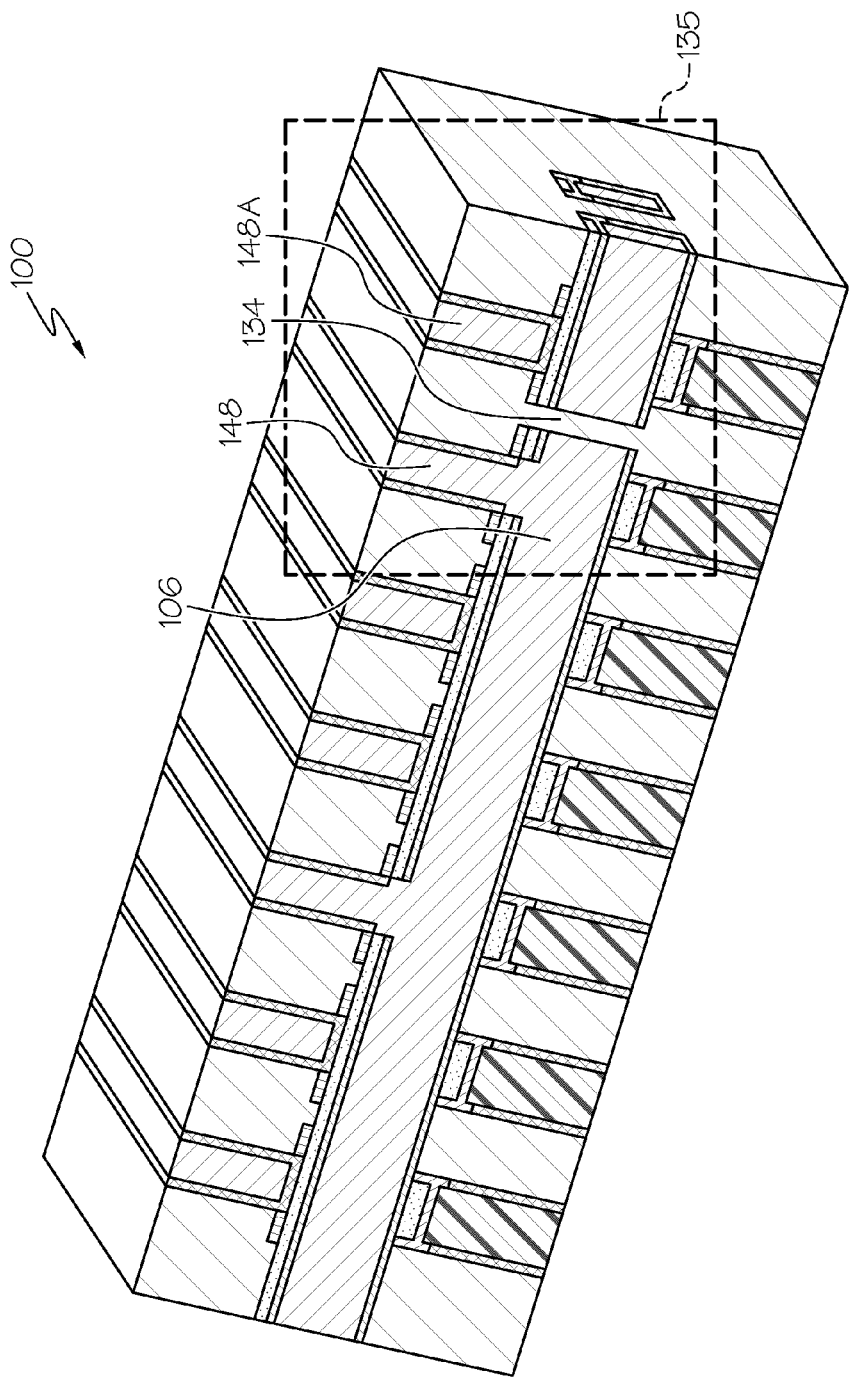

FIG. 21 is a cross section view of the structure of FIG. 20.

Figure 22:
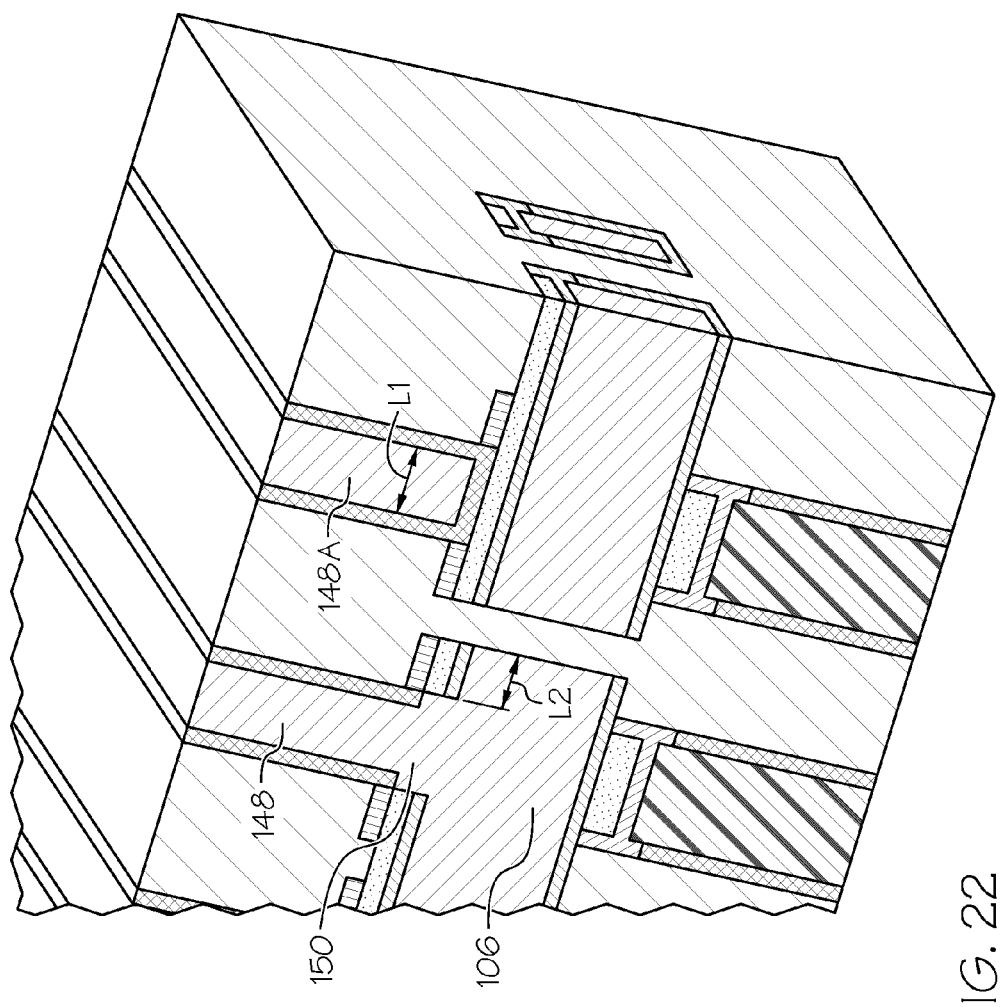

FIG. 22 is a detailed view of FIG. 21.

Figure 23:
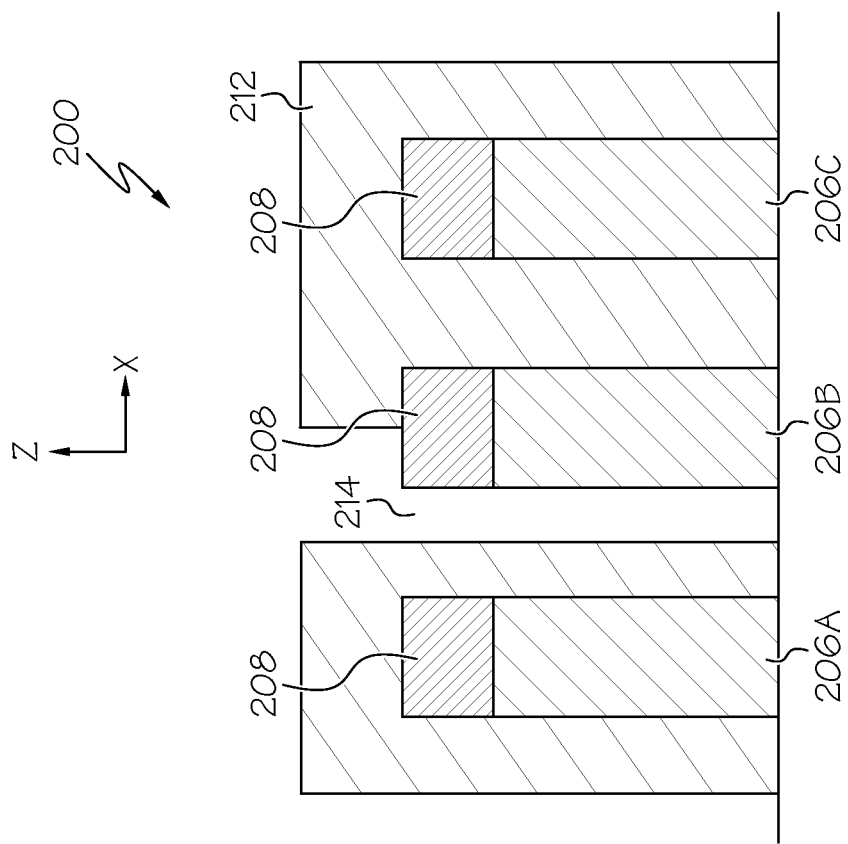

FIG. 23 is a side view indicating an alternative embodiment.

Figure 24:
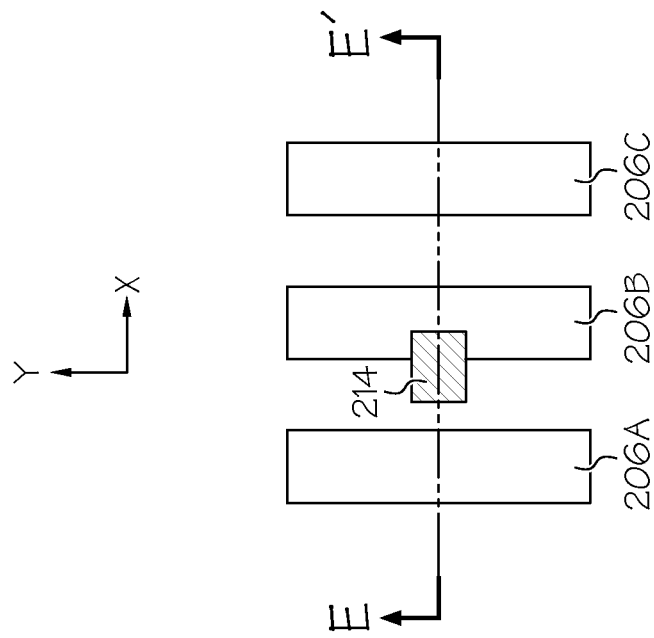

FIG. 24 is a top down view of the structure of FIG. 23.

Figure 25:
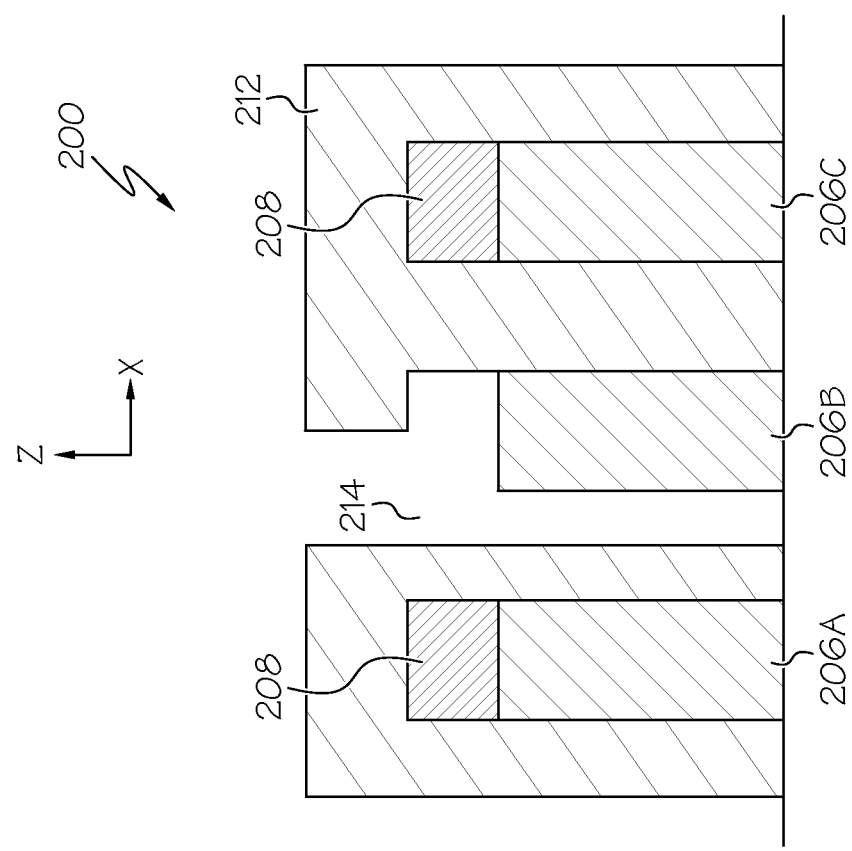

FIG. 25 is a side view after a subsequent process step of removing the cap of a metal line.

Figure 26:
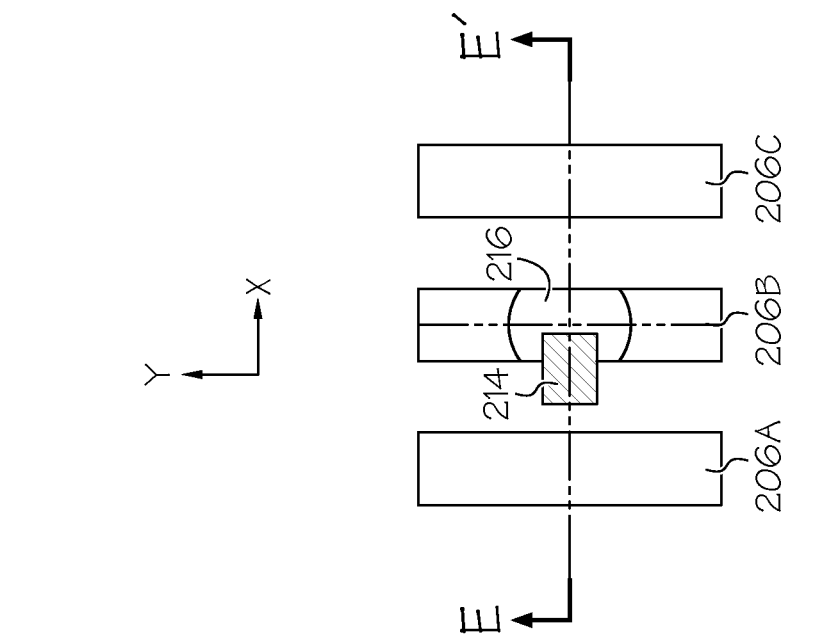

FIG. 26 is a top down view of the structure of FIG. 25.

FIG. 27 is a side view after a subsequent process step of removing a metal line.

FIG. 28 is a top down view of the structure of FIG. 27.

Figure 29:
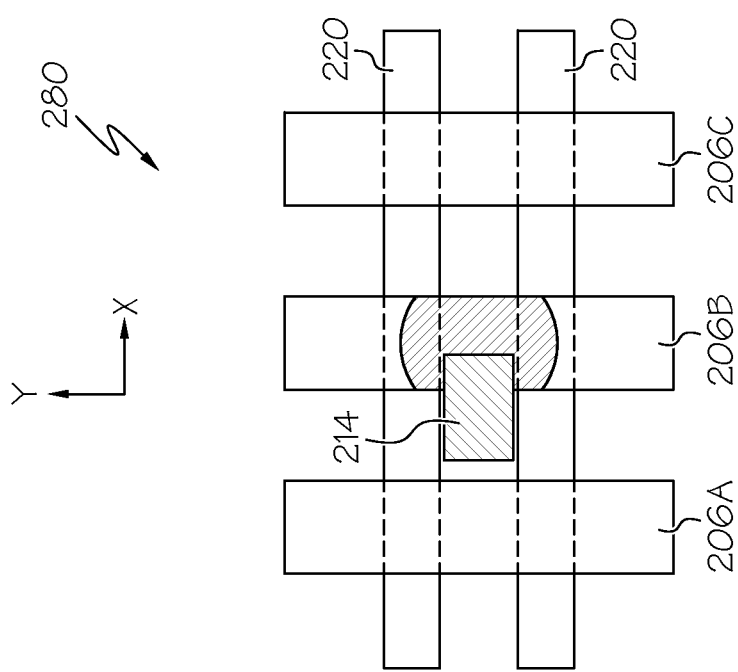

FIG. 29 is a top down view of an alternative embodiment including spacer lines.

Figure 30:
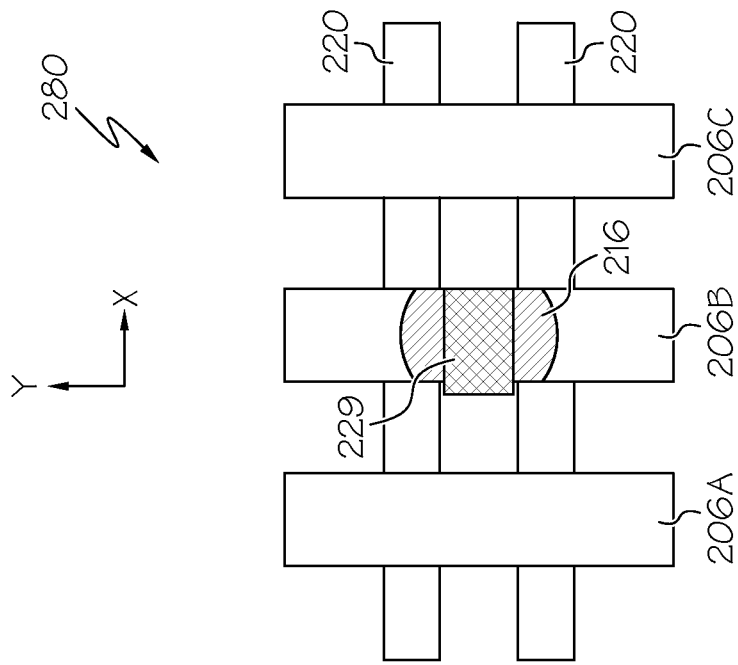

FIG. 30 is a top down view of the structure of FIG. 29.

Figure 31:
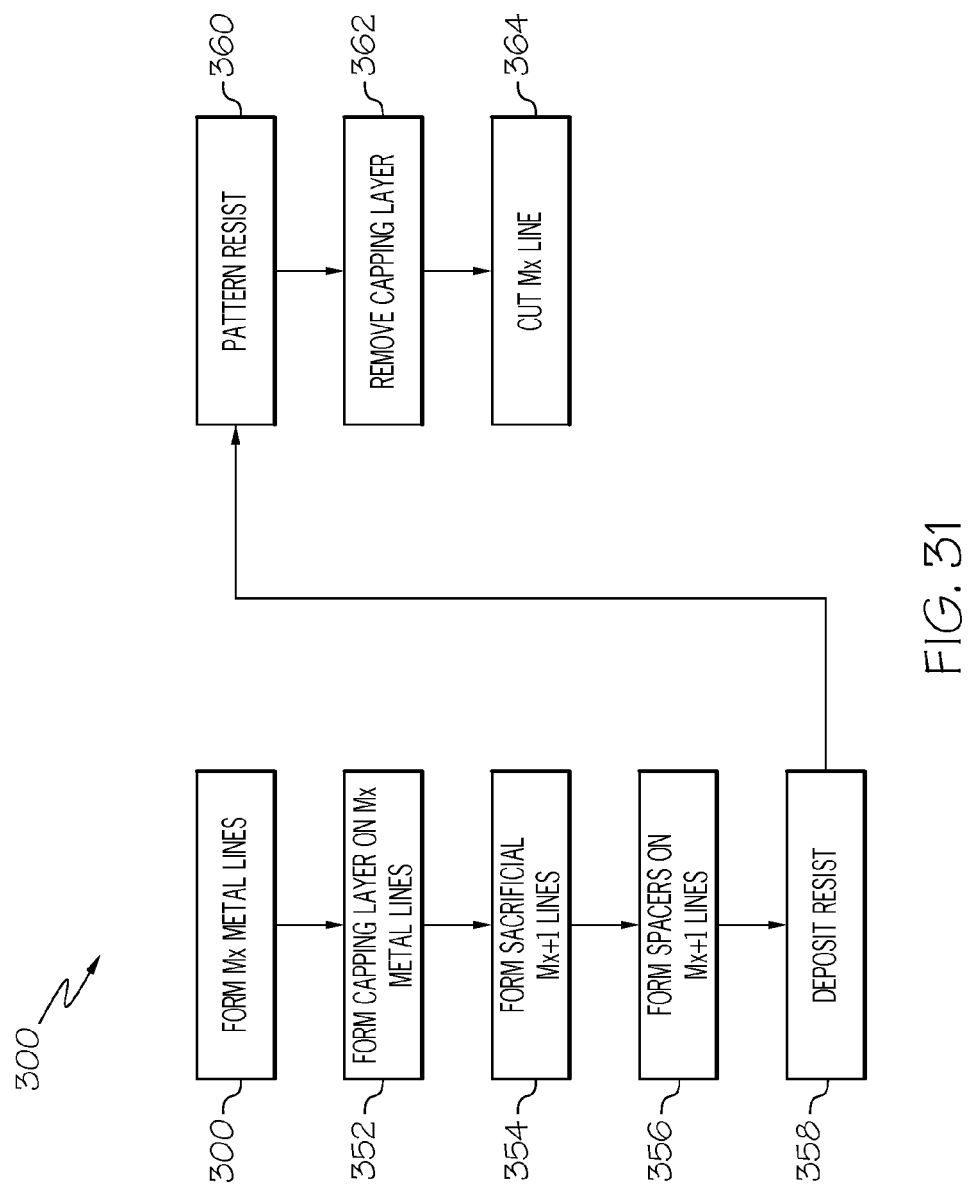

FIG. 31 is a flowchart indicating process steps for embodiments of the present invention.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g., a second layer, wherein intervening elements, such as an interface structure, e.g., interface layer, may be present between the first element and the second element.

FIG. 1 is a semiconductor structure 100 at a starting point for embodiments of the present invention. Semiconductor structure 100 shows a back-end-of-line (BEOL) wiring structure having a plurality of metal lines 106, which are formed in a dielectric layer 102. In embodiments, dielectric layer 102 may be comprised of SiOC (silicon oxycarbide). In embodiments, the metal lines 106 are comprised of copper. In embodiments, a barrier layer 104 is disposed on surfaces of the metal lines. This serves to prevent diffusion of the metal. In embodiments, the barrier layer 104 is comprised of tantalum and/or tantalum nitride. The metal lines 106 are referred to as Mx lines, where "x" denotes a particular metallization level. Below metal lines 106 are metal lines 103. Thus, metal lines 103 are referred to as Mx−1 metal lines. The metal lines may be formed using industry-standard techniques, including, but not limited to, barrier deposition, metal seed layer deposition, a metal plating process, followed by a planarization process. It is possible to have air gaps between adjacent metal lines to improve isolation between them (not shown).

FIG. 2 is semiconductor structure 100 after a subsequent process step of recessing the Mx metal lines 106 to a level below a top surface of the dielectric layer 102. The barrier layer 104 may also be recessed. The recessing may be performed by an anisotropic removal process. The lines 106 are recessed to a depth D1. In embodiments, D1 ranges from about 10 nanometers to about 15 nanometers. A cobalt layer may optionally be formed after the recess process to provide a thin protective cap over the MX metal lines and reduce the risk of electromigration during operating of the integrated circuit.

FIG. 3 is a detailed view of semiconductor structure 100 after a subsequent process step of depositing a capping layer 108 on the metal lines. Prior to depositing the capping layer 108, thin stopping layer 105 may be deposited on the tops of the metal lines 106. In embodiments, the stopping layer 105 may be comprised of SiN (silicon nitride). In embodiments, the capping layer 108 may be comprised of SiO2 (silicon oxide). After the deposition of the capping layer 108, a planarization process (such as a chemical mechanical polish (CMP) process) may be used to make the capping layer 108 flush with the dielectric layer 102.

FIG. 4 is semiconductor structure 100 after a subsequent process step of depositing an etch stop layer 110 over the semiconductor structure. In embodiments, the etch stop layer is comprised of aluminum oxide (Al2O3), and may be deposited using an atomic layer deposition (ALD) process.

FIG. 5 is semiconductor structure 100 after a subsequent process step of depositing a sacrificial layer 112 over the semiconductor structure. The sacrificial layer 112 is deposited on the etch stop layer 110. In embodiments, the sacrificial layer 112 may be comprised of SiN, and may be deposited by plasma enhanced chemical vapor deposition (PECVD). Amorphous silicon can also be used as a sacrificial material.

FIG. 6 is semiconductor structure 100 after a subsequent process step of patterning a resist layer 114 on the semiconductor structure. The pattern may be accomplished using industry-standard lithographic methods, including, but not limited to, self-aligned double patterning (SADP), or self-aligned quad patterning (SAQP).

FIG. 7 is semiconductor structure 100 after a subsequent process step of forming sacrificial "dummy" Mx+1 lines on the semiconductor structure. This may be achieved by anisotropically etching the sacrificial layer 112 (stopping on etch stop layer 110) to form sacrificial "dummy" lines 116, and then removing the resist layer 114. In some embodiments, etch stop layer 110 may also be removed. Note that both Mx and Mx+1 are illustrated as a regular set of unidirectional parallel lines at each level, with Mx+1 perpendicular to Mx.

FIG. 8 is semiconductor structure 100 after a subsequent process step of depositing a spacer layer 118 on the semiconductor structure. The spacer layer 118 is a conformal film that follows the contour of the sacrificial Mx+1 lines 116. As a result, a gap 120 is formed between each sacrificial line 116.

FIG. 9 is semiconductor structure 100 after a subsequent process step of recessing the spacer layer on the semiconductor structure such that the tops of the sacrificial lines 116 are exposed. This forms side spacers 122. Region 10 indicates an area of detail shown in FIG. 10.

FIG. 10 is a detailed view of the spacers of FIG. 9, as shown in a top-down view. Two neighboring lines 116A and 116B are shown. Spacer 122A of line 116B is adjacent to spacer 122B of line 116B, with a gap D2 in between spacer 122A and spacer 122B. In embodiments, the gap D2 has a distance ranging from about 5 nanometers to about 15 nanometers. In particular embodiments, the gap D2 ranges from about 11 nanometers to about 12 nanometers.

FIG. 11 is semiconductor structure 100 after removing a portion of the etch stop layer (see 110 of FIG. 4) disposed between spacers of adjacent sacrificial Mx+1 lines. This reveals the capping layer of the Mx lines, as indicated by reference 124. The spacers 122A and 122B of the sacrificial Mx+1 lines are used to force the position of cuts to the Mx level as in between Mx+1 lines, thus ensuring that the cuts will not encroach on any vias that interconnect the Mx and Mx+1 levels.

FIGS. 12A and 12B are semiconductor structure 100 after removal of depositing and patterning a resist layer on the semiconductor structure. FIG. 12A shows the deposition of a photoresist (resist) layer 126 with a plurality of holes 128 formed therein. A hole 128 in resist layer 126 is formed for any desired Mx line cuts. Box 129 indicates an area of additional detail shown in FIG. 12B. Referring now to FIG. 12B, the hole 128 in resist layer 126 reveals the capping layer 124, which is bounded by spacers 122A and 122B. Thus, the position and size of the hole 128 has relaxed requirements, as the final critical dimension of the cut is determined by the Mx+1 spacers 122A and 122B, which have a gap D2 (see FIG. 10).

FIG. 13 is detail of semiconductor structure 100 after a subsequent process step of performing a metal line cut. This may be performed using anisotropic etch processes. The etch process may include first cutting the dielectric cap 108 over the metal line, followed by another etch process for cutting of the metal line 106 itself. As a result, a gap 130 is formed in the underlying Mx metal line, thus forming a cut in the line at that position.

FIG. 14 is detail of semiconductor structure 100 after a subsequent process step of removing the resist layer (see 126 of FIG. 12A). As can now be observed, a metal cut is achieved by gap 130, while the metal line remains intact (not cut) where cap 124 was previously covered by the resist layer (see 126 of FIG. 12A).

FIGS. 15A, 15B, and 15C show views of semiconductor structure 100 after subsequent process steps of depositing additional dielectric layer and planarization. Referring now to FIG. 15A, an additional interlayer dielectric (ILD) material 132 is deposited. In embodiments, the ILD 132 is comprised of SiOC. This deposition can be tailored to result in the formation of an airgap (not shown) between adjacent lines. The structure is then planarized (such as with CMP) to expose the tops of sacrificial Mx+1 lines 116. FIG. 15B is a cross-section of FIG. 15A as viewed along line A-A'. As can be seen, there is a dielectric region 134 that fills the gap 130 (see FIG. 13), thus forming a cut in metal Mx line 106. Note that the dielectric region 134 is substantially equidistant between sacrificial Mx+1 line 116A and sacrificial Mx+1 line 116B, thus ensuring that the cut of the Mx line will not encroach on any vias formed between the Mx and Mx+1 levels. FIG. 15C is a cross-section of FIG. 15A as viewed along line B-B'. As can be seen in this view, dielectric region 134 is in place of the cut metal line, while other metal Mx lines 106 are intact along line B-B'.

FIG. 16 is semiconductor structure 100 after a subsequent view of removing the dummy Mx+1 lines (see 116 of FIG. 15A). This may be performed using a selective etch process.

FIG. 17 is a semiconductor structure 100 after a subsequent process step of removing the etch stop layer (see 110 of FIG. 4). As a result, the capping layer 108 of the metal Mx lines is exposed. By removing selected caps, vias between the Mx and Mx+1 layer can be formed at the desired locations.

FIG. 18 is semiconductor structure 100 after a subsequent process step of depositing and patterning a resist layer 140 on the semiconductor structure. A plurality of openings (holes) 142 are formed in the resist layer 140 where it is desired to form a Vx via (Vx is a via level between Mx and Mx+1). The holes do not have to be precisely aligned, since the via position is determined by the position of capping layer 108. Since the capping layer 108 is positioned directly over the Mx metal lines, the subsequently formed Vx vias are properly positioned on the Mx metal lines. The formation of the via cavities may include etching the capping layer 108 and the thin stopping layer (see 105 of FIG. 3) to expose the underlying Mx metal (e.g., 106 in FIG. 15B).

FIG. 19 is a semiconductor structure 100 after subsequent process step of forming via cavities 144 over selected Mx lines at the desired locations (corresponding to holes 142). The resist layer (140 of FIG. 18) is then removed.

FIG. 20 is semiconductor structure 100 after a subsequent process step of forming Mx+1 lines 148. In embodiments, the metal lines 148 are comprised of copper. In embodiments, a barrier layer 146 is disposed on surfaces of the metal lines. This serves to prevent diffusion of the metal. In embodiments, the barrier layer 146 is comprised of cobalt, tantalum, and/or tantalum nitride. The metal lines 148 are referred to as Mx+1 metal lines. The metal lines may be formed using industry-standard techniques, including, but not limited to, barrier deposition, metal seed layer deposition, and/or a metal plating process, followed by a planarization process.

FIG. 21 is a cross-section view of the structure of FIG. 20 as viewed along line C-C'. In this view, it can be observed that Mx+1 metal line 148 is electrically connected to metal Mx line 106 using a self-aligned via in accordance with embodiments of the present invention. Furthermore, there is metal cut in line 106, where dielectric region 134 is positioned, which is substantially equidistant between metal Mx+1 line 148 and metal Mx+1 line 148A.

FIG. 22 is a detailed view of FIG. 21, showing details of the area indicated by box 135. Via 150 connects metal line 148 with metal line 106. Via 150 is formed when metal used in forming metal Mx+1 line 148 is deposited into via cavities 144 (see FIG. 19). Metal line 148 has line width L1. In embodiments, L1 may range from about 20 nanometers to about 40 nanometers. Via 150 is at a distance L2 from the end of metal line 106. In embodiments, L2 ranges from about 10 nanometers to about 15 nanometers. With embodiments of the present invention, the precise self-aligned cuts reduce the need for large via enclosure design rules. This enables increased circuit density. Thus, L2 is less than L1, which has previously been unachievable while still maintaining sufficient circuit reliability.

FIG. 23 is a side view of a semiconductor structure 200 indicating an alternative embodiment. In some cases, for the stage of the flow described in FIG. 12B, due to overlay error, the resist openings 214 may not fully expose a metal line to be cut. In the case of FIG. 23, it is desired to cut metal line 206B, while preserving metal lines 206A and 206C. A capping layer 208 is deposited on each line, and a layer of resist 212 is deposited over the lines. However, due to overlay error, the opening 214 in the resist 212 does not completely expose the capping layer 208 of metal line 206B. In embodiments, the capping layer 208 may be comprised of SiO2, SiN, or other suitable material.

FIG. 24 is a top down view of structure 200 of FIG. 23. For the sake of clarity, the resist layer 212 is not shown. However, the opening in the resist layer is indicated by the rectangle 214 as being off center from metal line 206B. Line E-E' indicates the cross section along which FIG. 23 is shown. Subsequent figures will show how embodiments of the present invention mitigate this problem.

FIG. 25 is a side view of structure 200 after a subsequent process step of removing the cap of a metal line. An isotropic etch process is used, such that even if the capping layer of line 206B is not fully exposed, it can still be completely removed. Line E-E' indicates the cross-section along which FIG. 25 is shown.

FIG. 26 is a top down view of structure 200 of FIG. 25. Region 216 indicates an area where the capping layer 208 is removed from line 206B. As can be seen, due to isotropic etching, the opening is expanded in Y direction beyond the extent of opening 214. This increases the critical dimension in the Y direction. However, this can be mitigated, as will be explained in the description for subsequent figures.

FIG. 27 is a side view of structure 200 after a subsequent process step of removing a metal line. As can be seen, line 206B is removed, leaving only lines 206A and 206C.

FIG. 28 is a top down view of structure 200 of FIG. 27. Region 218 indicates an area where the metal line 206B has been removed. As can be seen, due to isotropic etching, the opening is expanded in Y direction beyond the extent of opening 214. This increases the critical dimension in the Y direction. However, this can be mitigated, as will be explained in the description for subsequent figures. Line E-E' indicates the cross-section along which FIG. 27 is shown.

FIG. 29 is a top down view of a semiconductor structure 280 in accordance with an alternative embodiment including spacer lines 220. The spacer lines 220 may be spacers disposed on Mx+1 dummy lines (e.g., 122A and 122B of FIG. 14). Thus, by performing an isotropic etch on the capping layer of the lines, the exposed metal region 216 is formed, including a portion in an undercut of the capping layer below the lines 220. The spacer lines 220 are then used in making an anisotropic metal cut as is shown in FIG. 30.

FIG. 30 is a top down view of structure 200 of FIG. 29 after a subsequent process step of an anisotropic metal cut 229. Thus, by using the isotropic removal of the capping layer, overlay issues are mitigated. Then, by using an anisotropic metal cut, using the spacers of the Mx+1 lines, the critical dimension of the cut in the Y direction is controlled. Thus, embodiments of the present invention serve to improve yield and circuit density by enabling controlled metal line cuts and via formation using self-aligned processes. Embodiments of the present invention solve the issue known as "Edge Placement Error".

FIG. 31 is a flowchart 300 indicating process steps for embodiments of the present invention. In process step 350, metal Mx lines are formed. In process step 352, a capping layer (e.g., SiO2) is formed on the Mx metal lines. In process step 354, sacrificial Mx+1 lines are formed. In process step 356, spacers are formed on the Mx+1 lines. The gap between spacers of neighboring Mx+1 lines controls the width of the Mx metal line cuts. In process step 358, resist is deposited on the semiconductor structure. In process step 360, the resist is patterned to form openings (holes) corresponding to the desired Mx line cut locations. In process step 362, the capping layer is then removed from above the Mx lines where the resist openings were formed. In process step 364, the metal lines are cut.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:

forming a plurality of Mx metal lines in a dielectric layer;

depositing a capping layer over the plurality of Mx metal lines;

forming a plurality of sacrificial Mx+1 lines on the dielectric layer;

forming spacers adjacent to each of the plurality of sacrificial Mx+1 lines;

depositing a first resist layer over the plurality of sacrificial Mx+1 lines;

forming an opening in the first resist layer at a location corresponding to a line cut for at least one Mx metal line of the plurality of Mx metal lines;

removing the capping layer at the location corresponding to the line cut; and performing a metal etch to cut the at least one Mx metal line of the plurality of Mx metal lines.

2. The method of claim 1, further comprising:
removing the plurality of sacrificial Mx+1 lines;
depositing a second resist layer over the plurality of Mx metal lines;
forming an opening in the second resist layer at a location corresponding to a via for the at least one MX metal line of the plurality of Mx metal lines; and
forming a plurality of Mx+1 lines and the via.

3. The method of claim 1, further comprising:
depositing an etch stop layer over the dielectric layer and capping layer; and
removing a portion of the etch stop layer disposed between spacers of adjacent sacrificial Mx+1 lines.

4. The method of claim 3, wherein depositing an etch stop layer comprises depositing aluminum oxide (Al2O3).

5. The method of claim 4, wherein depositing Al2O3 is performed using an atomic layer deposition process.

6. The method of claim 1, wherein forming a plurality of sacrificial Mx+1 lines comprises depositing silicon nitride.

7. The method of claim 1, wherein forming spacers comprises depositing silicon oxycarbide (SiOC).

8. The method of claim 1, wherein forming spacers comprises positioning the spacers such that there is a gap between neighboring spacers of adjacent sacrificial Mx+1 lines.

9. The method of claim 1, wherein depositing a capping layer comprises depositing silicon oxide.

10. A method of forming a semiconductor structure, comprising:
forming a plurality of Mx metal lines in a dielectric layer;
depositing a capping layer over the plurality of Mx metal lines;
depositing an etch stop layer over the dielectric layer and capping layer;
forming a plurality of sacrificial Mx+1 lines on the etch stop layer;
forming spacers adjacent to each of the plurality of sacrificial Mx+1 lines;
removing a portion of the etch stop layer disposed between spacers of adjacent sacrificial Mx+1 lines;
depositing a first resist layer over the plurality of sacrificial Mx+1 lines;
forming an opening in the first resist layer at a location corresponding to a line cut for at least one MX metal line of the plurality of Mx metal lines;
performing an isotropic etch on the capping layer at the location corresponding to the line cut; and
performing an anisotropic metal etch to cut the at least one MX metal line of the plurality of Mx metal lines.

11. The method of claim 10, further comprising:
removing the plurality of sacrificial Mx+1 lines;
depositing a second resist layer over the plurality of Mx metal lines;
forming an opening in the second resist layer at a location corresponding to a via for the at least one MX metal line of the plurality of Mx metal lines; and
forming a plurality of Mx+1 lines and the via.

12. The method of claim 10, wherein depositing a capping layer comprises depositing silicon oxide.

13. The method of claim 10, wherein depositing an etch stop layer comprises depositing aluminum oxide (Al2O3).

14. The method of claim 10 wherein forming a plurality of sacrificial Mx+1 lines comprises depositing silicon oxycarbide (SiOC).

15. The method of claim 10, wherein forming a plurality of sacrificial Mx+1 lines comprises depositing silicon nitride.

16. The method of claim 10, wherein forming spacers comprises depositing silicon oxycarbide (SiOC).

17. The method of claim 10, wherein forming spacers comprises positioning the spacers such that there is a gap between neighboring spacers of adjacent sacrificial Mx+1 lines.

\* \* \* \* \*